(12) United States Patent
Kaku

(10) Patent No.: US 7,161,867 B2
(45) Date of Patent: Jan. 9, 2007

(54) SEMICONDUCTOR MEMORY DEVICE

(75) Inventor: Mariko Kaku, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/344,016

(22) Filed: Feb. 1, 2006

(65) Prior Publication Data
US 2006/0171237 A1 Aug. 3, 2006

(30) Foreign Application Priority Data
Feb. 2, 2005 (JP) ............... 2005-026711

(51) Int. Cl.
*G11C 8/00* (2006.01)
(52) U.S. Cl. ............... 365/230.03; 365/63; 365/189.01
(58) Field of Classification Search ............ 365/230.03
See application file for complete search history.

(56) References Cited

U.S. PATENT DOCUMENTS

| | | | |
|---|---|---|---|
| 6,157,560 A * | 12/2000 | Zheng | 365/63 |
| 6,345,010 B1 * | 2/2002 | Shimazaki et al. | 365/230.03 |
| 6,385,121 B1 | 5/2002 | Lee | |
| 6,452,824 B1 * | 9/2002 | Okamura | 365/51 |
| 6,603,701 B1 | 8/2003 | Mizugaki et al. | |
| 6,678,191 B1 * | 1/2004 | Lee et al. | 365/185.17 |
| 2006/0200728 A1 * | 9/2006 | Nagai et al. | 714/763 |

FOREIGN PATENT DOCUMENTS

JP 2002-304881 10/2002

OTHER PUBLICATIONS

U.S. Appl. No. 11/344,206, filed Feb. 1, 2006, Iizuka.
U.S. Appl. No. 11/344,016, filed Feb. 1, 2006, Kaku.

* cited by examiner

*Primary Examiner*—Son L. Mai
(74) *Attorney, Agent, or Firm*—Oblon, Spivak, McClelland, Maier & Neustadt, P.C.

(57) ABSTRACT

In a semiconductor memory device, sub-macros are connected sequentially onto an interface unit in which each sub-macro includes a data control unit connected to the interface unit through a global data line, a first memory block and a second memory block. The first memory block is connected to one side of the data control unit through a first local data line, and the second memory block is connected to the other side of the data control unit through a second local data line.

20 Claims, 19 Drawing Sheets

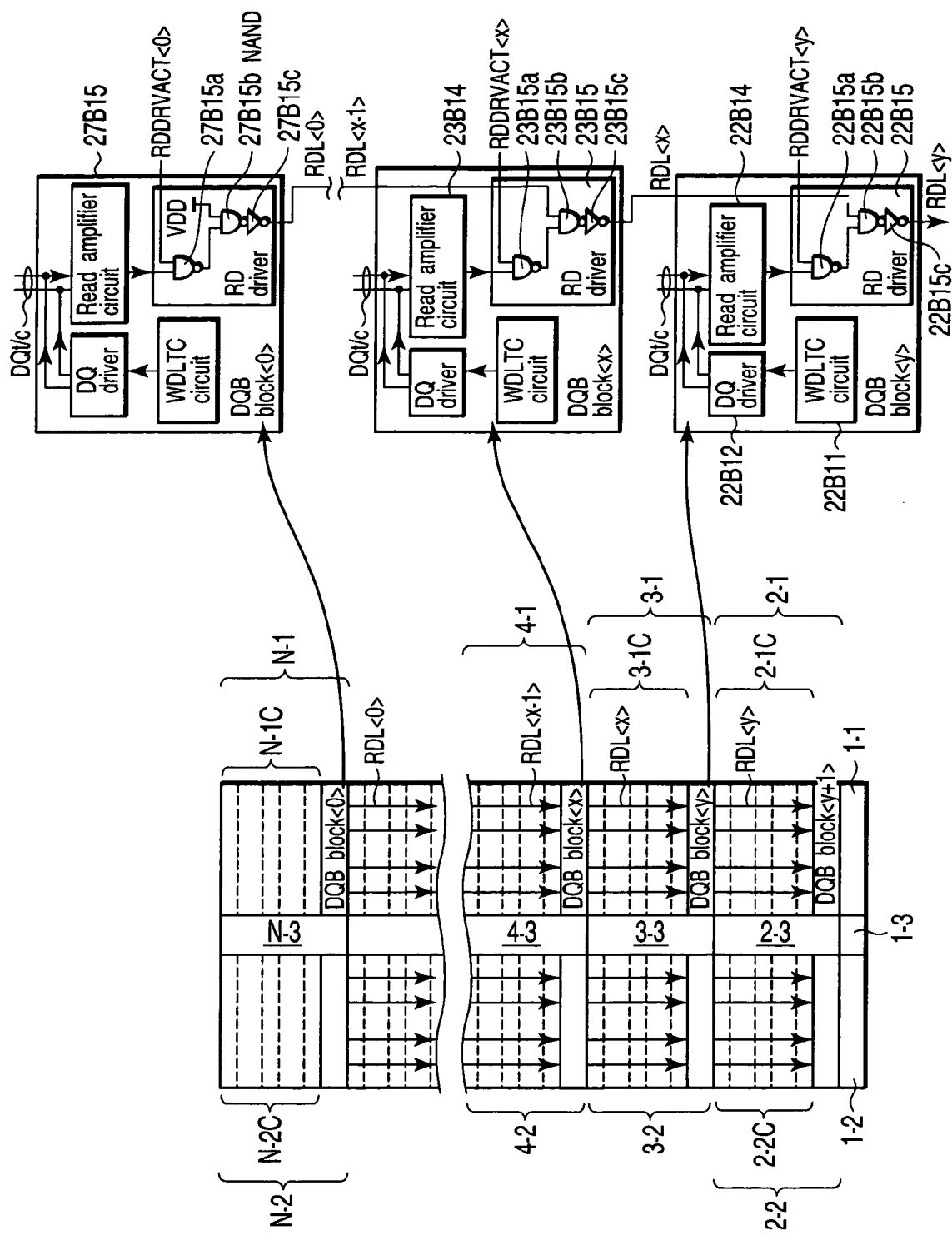
F I G. 24

SEMICONDUCTOR MEMORY DEVICE

CROSS-REFERENCE TO RELATED APPLICATIONS

This application is based upon and claims the benefit of priority from prior Japanese Patent Application No. 2005-026711, filed Feb. 2, 2005, the entire contents of which are incorporated herein by reference.

BACKGROUND OF THE INVENTION

1. Field of the Invention

The present invention relates to a semiconductor memory device such as eDRAM (embedded DRAM), which is formed by cascading plural memory cell arrays in association with an interface unit such as an I/O block.

2. Description of the Related Art

For example, a conventional eDRAM is configured as shown in FIG. 27. Referring to FIG. 27, plural cascaded memory cell arrays 101-1 to 101-n are mounted on a semiconductor substrate with respect to an I/O block 100 to form eDRAM. These memory cell arrays 101-1 to 101-n and the I/O block 100 connected to an external circuit 102 are connected through a write data line 103 and a read data line 104. In writing data, write data from the external circuit 102 is inputted to the I/O block 100, and the write data is written in, e.g., the memory cell array 101-n from the I/O block 100 through the write data line 103. In reading data, read data is read from, e.g., the memory cell array 101-n to the I/O block 100 through the read data line 104, and the read data is outputted to the external circuit 102 through the I/O block 100.

Thus, a memory macro having large data storage capacity can be obtained by cascading the I/O block 100 and the memory cell arrays 101-1 to 101-n. In the eDRAM, from the design viewpoint, since it is generally difficult that the I/O block 100 is located inside the memory cell array, the I/O block 100 should be located near the external circuit 102 as shown in FIG. 27.

There is also a proposal in which a chip size of a semiconductor memory device is miniaturized by sharing a preamplifier for read and write and a write driver between the two adjacent memory cell arrays while a sense amplifier is configured in the memory cell array in forming eDRAM (for example, see Jpn. Pat. Appln. KOKAI Publication No. 2002-304881).

However, when eDRAM having the large capacity is configured by cascading the plural memory cell arrays to the I/O block, line lengths of the write data line 103 and read data line 104 is increased in order to connect the I/O block and each memory cell array. Therefore, while RC delay is increased, influence caused by the RC delay difference between the memory cell array close to the I/O block and the memory cell array far away from the I/O block cannot be neglected, which results in an obstacle to a high-speed eDRAM. In the method described in Jpn. Pat. Appln. KOKAI Publication No. 2002-304881, although the chip size can be miniaturized, the data line length cannot be prevented from increasing in relation to the increase in capacity. Therefore, the problem of the RC delay cannot also be neglected.

BRIEF SUMMARY OF THE INVENTION

According to an aspect of the present invention, there is configured a semiconductor memory device comprising:

an interface unit which is connected to an external circuit;
a plurality of sub-macros which are connected to the interface unit through a global data line; and
a sub-macro control circuit which is connected to the sub-macros,
wherein each of the plurality of sub-macros includes a data control unit connected to the global data line, a first memory block connected onto one side of the data control unit through a first local data line, and a second memory block connected to the other side of the data control unit through a second local data line.

According to another aspect of the present invention, there is configured a semiconductor memory device comprising:

an interface unit which is connected to an external circuit;
a plurality of sub-macros which are connected to the interface unit through a global data line; and
a sub-macro control circuit which is connected to the sub-macros,
wherein each of the plurality of sub-macros includes a first data control unit connected to the global data line and a first memory block connected to one side of the first data control unit through a local data line, and
the global data line includes at least one redriver which is connected to a predetermined position of the global data line with respect to the plurality of sub-macros.

According to a further aspect of the present invention, there is configured a semiconductor memory device comprising:

an I/O block which is connected to an external circuit;
a plurality of sub-macros which are connected to the I/O block through a global data line;
a sub-macro control circuit which is arranged adjacent to each of the plurality of sub-macros; and
an I/O block control circuit which is adjacent to the I/O block, the I/O block control circuit being arranged adjacent to the sub-macro control circuit,
wherein each of the plurality of sub-macros includes a data control unit connected to the global data line and a memory block connected to the data control unit through a local data line,
the sub-macro control circuit includes a first driver circuit group corresponding to a control signal supplied to the memory block, a second driver circuit group corresponding to a control signal supplied to the data control unit, and data/memory block control signal activating circuit which generates a plurality of activating signals supplied to the first driver circuit group and the second driver circuit group,
the I/O block control circuit includes a third driver circuit group corresponding to a control signal supplied to the I/O block and an I/O block control signal activating circuit which generates an activating signal supplied to the third driver circuit group,
the I/O block control circuit includes a first clock interconnection, through which a clock signal is supplied to the data/memory block control signal activating circuit, and the I/O block control signal activating circuit and a second clock interconnection through which the clock signal is supplied to the first, second, and third driver circuit groups,
the first and second driver circuit groups in the plurality of sub-macros and the third driver circuit group in the I/O block generate the corresponding control signals in synchronization with the clock signal during activating intervals of the corresponding activating signals respectively,
the I/O block control circuit includes first and second clock drive circuits corresponding to the first and second clock interconnections.

BRIEF DESCRIPTION OF THE SEVERAL VIEWS OF THE DRAWING

FIG. 24 is a block diagram showing a configuration of a further embodiment in which the embodiment of FIG. 18 is applied to the reference example of FIG. 1;

DETAILED DESCRIPTION OF THE INVENTION

In advance of the detailed description of preferred embodiments, a reference example (not prior art) on which the present invention is predicated will first be described.

Figure 1:
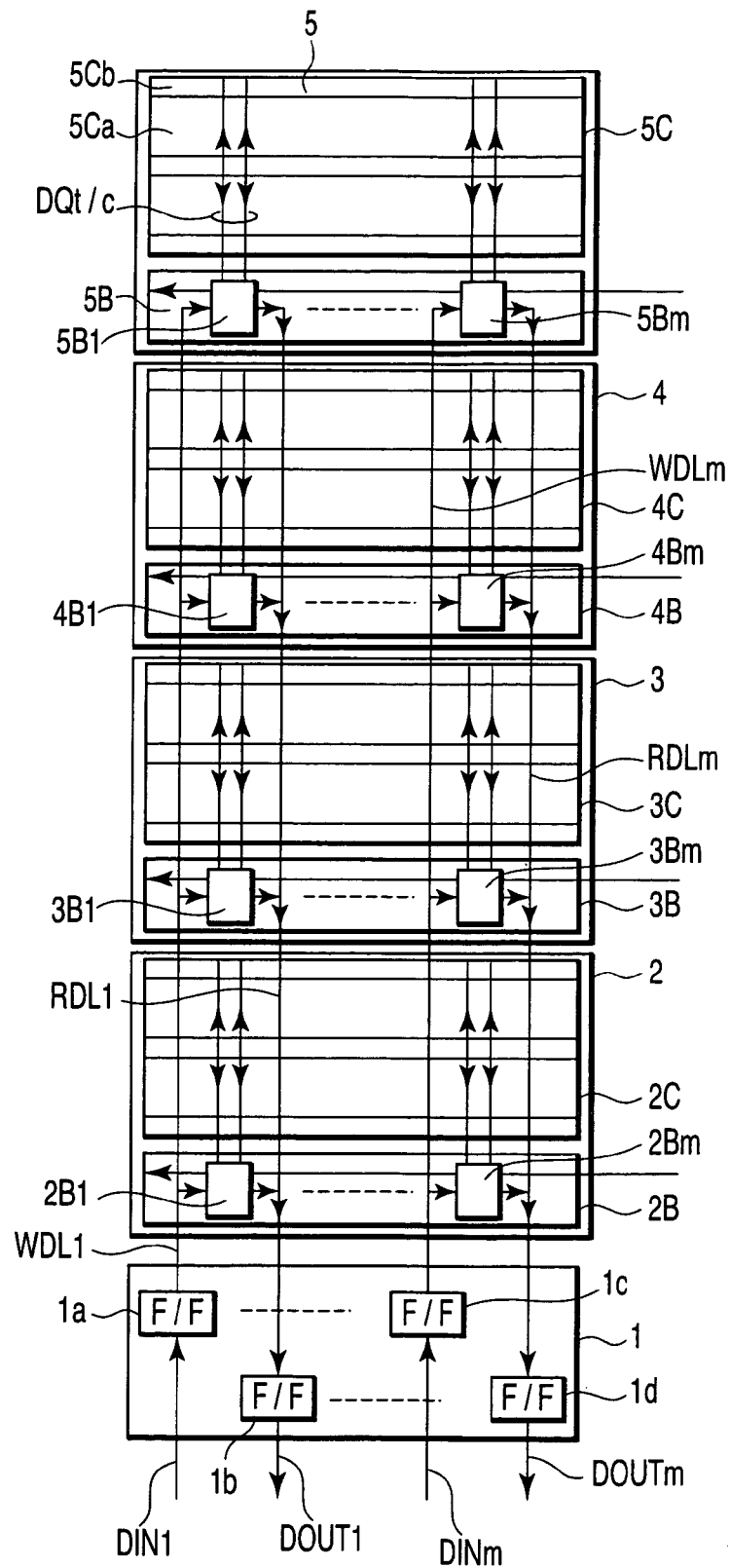
FIG. 1 is a block diagram showing an entire configuration of a circuit of a reference example on which the present invention is predicated.

FIG. 1 is a block diagram showing an entire configuration of a circuit of an eDRAM of a reference example. The circuit has an I/O block 1 which is of an interface circuit transmitting and receiving data to and from an external circuit (not shown). The pieces of input data DIN1 to DINm supplied to the I/O block 1 from the external circuit are respectively latched by flip-flops 1a, ... 1c constituting a latch circuit provided in the I/O block 1. The pieces of input data DIN1 to DINm latched by the flip-flops 1a, ... 1c are respectively transmitted to global data lines WDL1 to WDLm connected to the I/O block 1, and the pieces of input data DIN1 to DINm are supplied to DQB blocks 2B to 5B which are of data control circuits of plural sub-macros 2 to 5 commonly connected to the global data lines WDL1 to WDLm.

The DQB blocks 2B to 5B include plural DQB circuit 2B1 to 2Bm, 3B1 to 3Bm, 4B1 to 4Bm, and 5B1 to 5Bm respectively, and the DQB blocks 2B to 5B are connected to memory blocks 2C to 5C through local data lines DQt/c respectively. The DQB blocks 2B to 5B can perform the data write and read to the memory blocks 2C to 5C through the local data lines DQt/c respectively. For example, plural cell arrays 5Ca in which plural memory cells are arranged and plural SA (sense amplifier) blocks 5Cb connected to the cell array 5Ca are provided in the memory block 5C. Other memory blocks 2C to 4C are configured in the similar way.

Figure 2:
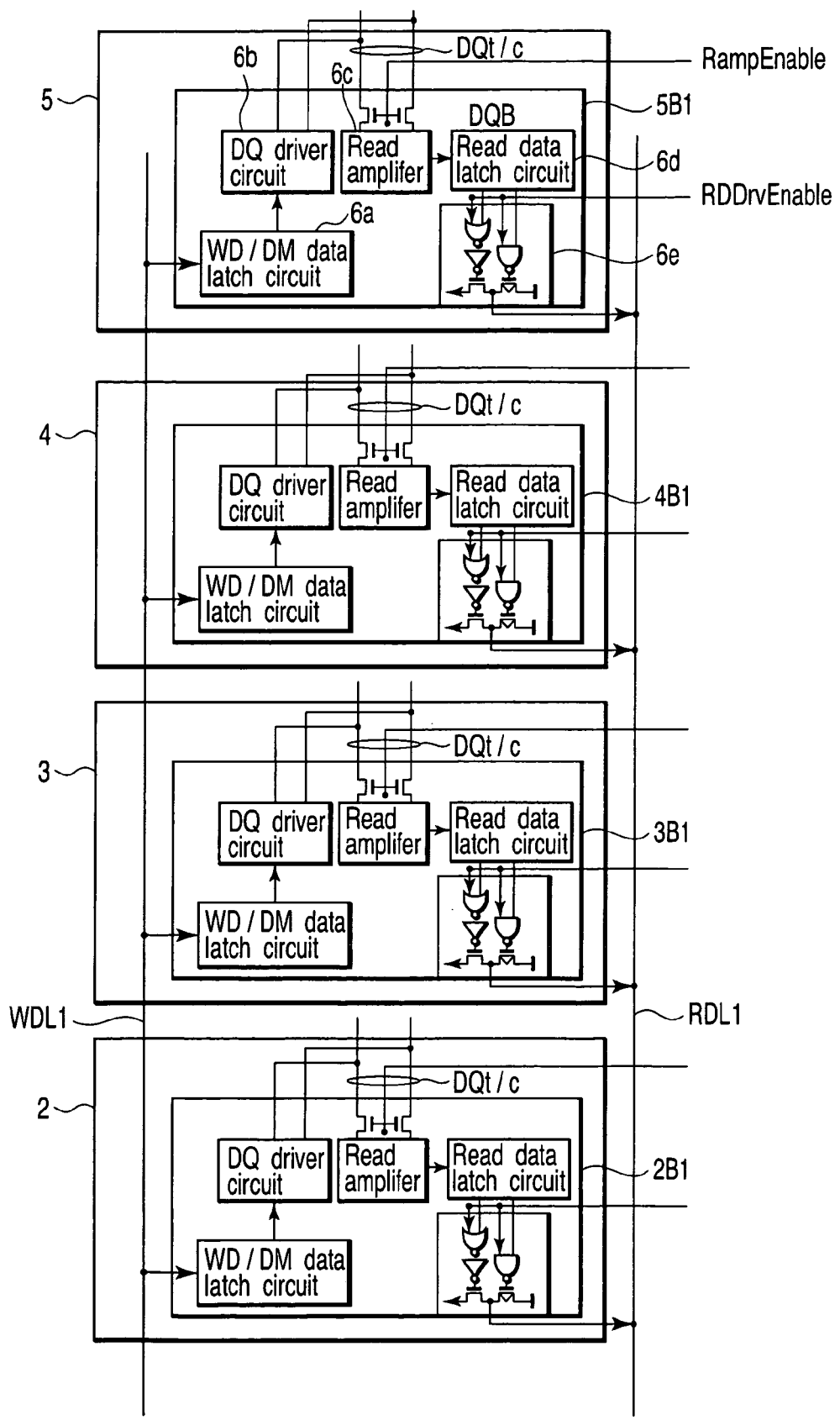
FIG. 2 is a detailed block diagram showing a part of the circuit shown in FIG. 1.

As shown in FIG. 2, the DQB circuits 2B1 to 5B1 provided in the sub-macros 2 to 5 have control circuits for the data write and read, respectively. In FIG. 2, for example, the DQB circuit 5B1 includes a latch circuit 6a, a DQ driver circuit 6b, a read amplifier 6c, a read data latch circuit 6d, and an output circuit 6e. The latch circuit 6a latches write data WD/DM from the global data line WDL1. The DQ driver circuit 6b supplies each bit of the write data WD/DM in the form of complementary write data to the local data lines DQt/c. The read amplifier 6c receives and amplifies complementary read data read from the memory block 5C. The read data latch circuit 6d latches output data of the read amplifier 6c. The output circuit 6e outputs the data latched by the latch circuit 6d to the global data line RDL1. Other DQB circuits 2B1 to 2Bm, 3B1 to 3Bm, and 4B1 to 4Bm shown in FIG. 1 are configured in the similar way.

Figure 3:
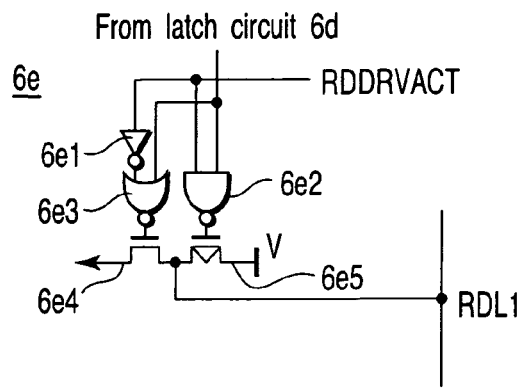
FIG. 3 is a block diagram showing an inner configuration of a part of the circuit shown in FIG. 2.

An internal configuration of the output circuit 6e shown in FIG. 2 will be described in detail with reference to FIG. 3. Referring to FIG. 3, the read data latched by the read data latch circuit 6d is supplied to one input of a NAND gate 6e2 and one input of a NOR gate 6e3. A drive enable signal RDDRVACT is directly inputted to the other input terminal of the NAND gate 6e2, and is inputted to the other input of the NOR gate 6e3 through an inverter 6e1. The output of the NOR gate 6e3 is supplied to a gate of an N-channel transistor 6e4, and the output of the NAND gate 6e2 is supplied to the gate of a P-channel transistor 6e5. A source side of the transistor 6e4 is grounded, and the source side of the transistor 6e5 is connected to a power supply having a voltage V. A connection point between the transistors 6e4 and 6e5 is connected to the global data line RDL1 for reading the data.

In FIG. 1, for example, when the input data DIN1 supplied to the I/O block 1 is written in the sub-macro 5, the input data DIN1 is first latched by the latch circuit 1a, then the input data DIN1 is latched by the latch circuit 6a of the DQB circuit SB1 of FIG. 2 through the global data line WDL1. The latched input data is written in the address-designated cell array in the memory block 5C by the DQ driver circuit 6b.

In reading the data, for example, when the memory block 5C is selected, the complementary data read on the local data lines DQt/c of the memory block 5C is captured by the read amplifier 6c by activating a read amplifier enable signal RampEnable. After the data is restored and amplified, the data delivered from the read amplifier 6c is latched by the latch circuit 6d, and the data is supplied to the output circuit 6e. When the read data from the latch circuit 6d is in an H-level, because the drive enable signal RDDRVACT in FIG. 3 becomes at the H-level in reading the data, the output of the NOR gate 6e3 becomes an L-level, and the transistor 6e4 becomes to a non-conductive state. On the other hand, because both the two input of the NAND gate 6e2 are in the H-level, the L-level is supplied to the gate of the transistor 6e5 to bring the transistor 6e5 in a conduction state, the H-level data at the connection point between the transistors 6e4 and 6e5, i.e., the read data of "1" is outputted through the global data line RDL1. When the read data from the latch circuit 6d is in the L-level, the transistor 6e4 is brought into the conduction state while the transistor 6e5 is non-conductive, the data "0" is delivered through the global data line RDL1.

When the memory block 5C is not selected, because the drive enable signal RDDRVACT is in the L-level, both the transistors 6e4 and 6e5 are of non-conductive state, and the output circuit 6e becomes a high impedance state.

Thus, the output circuit 6e is a tri-state buffer circuit having the three states of the state in which only the transistor 6e4 is in the conduction state, the state in which only the transistor 6e5 is in the conduction state, and the state in which both the transistors 6e4 and 6e5 are of non-conduction and with high impedance state (Hiz).

In the circuit configured as shown in FIG. 1 to FIG. 3, the memory macro is formed by cascading the four sub-macros 2 to 5 with the I/O block 1 through the global data lines WDL1 to WDLm, and RDL1 to RDLm, and the capacity can further be increased as the number of sub-macros cascaded with the global data line is increased. However, when the number of sub-macros is increased, the global data line length is increased, the RC delay is increased, and the high-speed operation is difficult to achieve. The following embodiments improve the above disadvantages.

Now, embodiments of the present invention configured based on the above knowledge will be described with reference to the drawings.

First Embodiment

Figure 4:
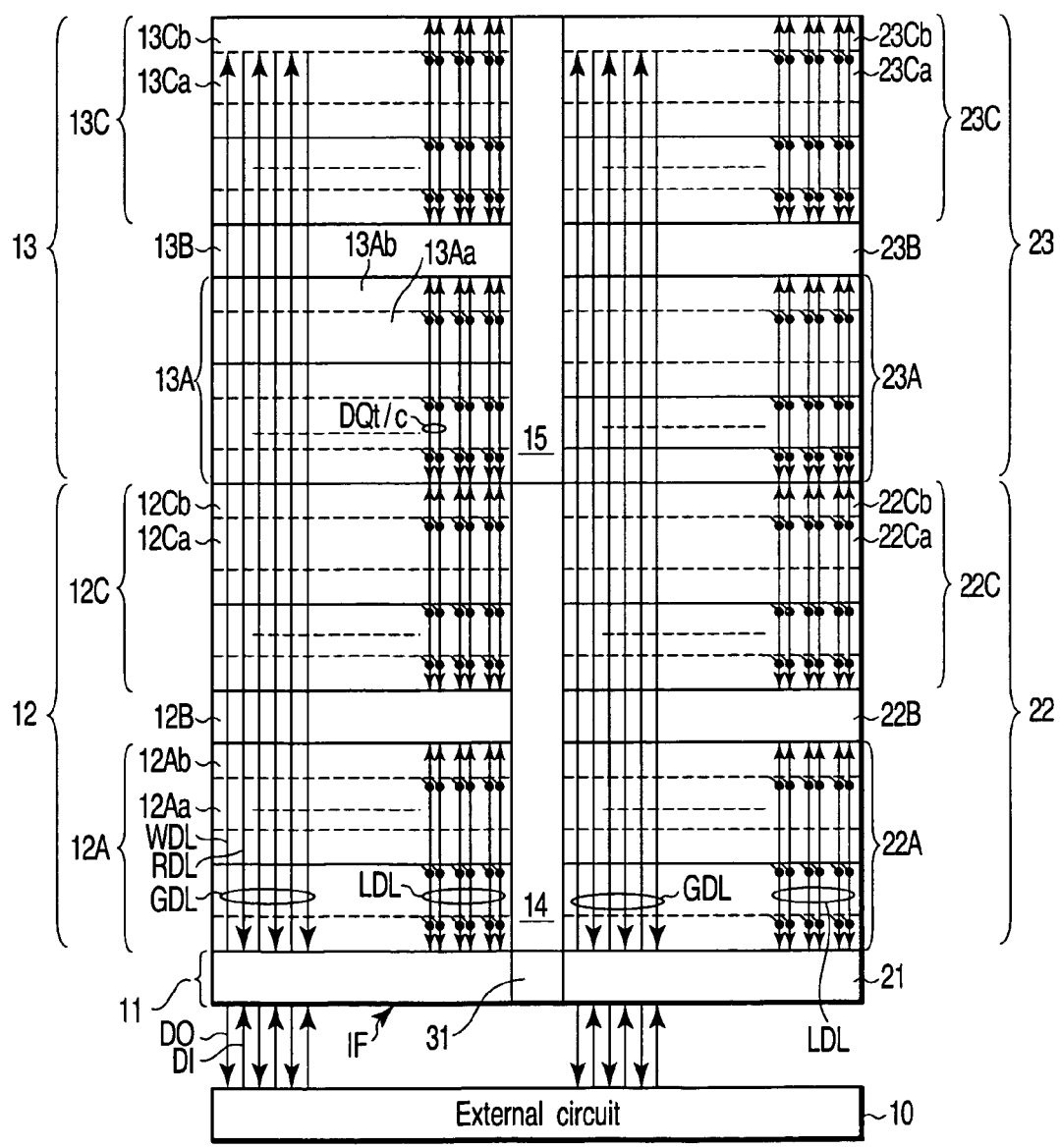
FIG. 4 is a block diagram showing a configuration of a first embodiment of the present invention.

FIG. 4 is a block diagram showing a configuration of a semiconductor memory device according to a first embodiment of the present invention. Referring to FIG. 4, two I/O blocks 11 and 21 which perform the data transmission to and reception from an external circuit 10 are arranged in parallel in a lateral direction through an I/O block control circuit 31. The I/O block control circuit 31 is located between the two I/O blocks 11 and 21 and is configured to be shared between the I/O blocks 11 and 21. The I/O blocks 11 and 21 as well as the I/O block control circuit 31 configure an interface unit IF as a whole.

On the I/O block 11 of the interface unit IF, the sub-macros 12 and 13 which are of a data memory unit are cascaded in a longitudinal direction. In this case the sub-macros 12 and 13 are sequentially arranged. Although the two sub-macros 12 and 13 are cascaded, the number of cascaded sub-macros may be determined according to the required memory capacity. Similarly two sub-macros 22 and 23 are provided on the I/O block 21.

The sub-macro 12 includes a first memory block 12A, a data control unit (hereinafter referred to as DQB block) 12B, and a second memory block 12C. The first memory block 12A is formed on the I/O block 11 while being adjacent to the I/O block 11. The DQB block 12B is formed on the first memory block 12A. The second memory block 12C is formed on the DQB block 12B. The memory block 12A includes plural cell arrays 12Aa and plural sense amplifier blocks 12Ab formed in relation to the cell arrays 12Aa. The memory block 12C is formed on the side of the DQB block 12B which is opposite the memory block 12A, and the memory block 12C also includes plural cell arrays 12Ca and plural sense amplifier blocks 12Cb formed in relation to the cell arrays 12Ca.

In the sub-macro 12, the DQB block 12B is commonly provided for the two memory blocks 12A and 12C which are arranged on one side and the other side of the DQB block 12B. The I/O block 11 and the DQB block 12B are connected by the plural global data lines GDL including the write data line WDL and the read data line RDL, and the DQB block 12B and the memory blocks 12A and 12C are connected to each other by the local data lines LDL including the complementary local data lines DQt/c.

Similarly the sub-macro 13 arranged on the sub-macro 12 includes a first memory block 13A formed on the memory block 12C, a DQB block 13B formed on the first memory block 13A, and a second memory block 13C formed on the DQB block 13B. The memory block 13A includes plural cell arrays 13Aa and plural sense amplifier blocks 13Ab formed in relation to the cell arrays 13Aa. The memory block 13C is formed on the side of the DQB block 13B which is opposite the memory block 13A, and the memory block 13C also includes plural cell arrays 13Ca and plural sense amplifier blocks 13Cb formed in relation to the cell arrays 13Ca.

In the sub-macro 13, the DQB block 13B is commonly provided for the two memory blocks 13A and 13C, which are arranged on one side and the other side of the DQB block 13B. The I/O block 11 and the DQB block 13B are connected by the plural global data lines GDL including the write data line WDL and the read data line RDL, and the DQB block 13B and the memory blocks 13A and 13C are connected to each other by the local data lines LDL including the complementary local data lines DQt/c.

A sub-macro control circuit 14 is formed along the memory block 12A, the DQB block 12B, and the memory block 12C, which constitute the sub-macro 12. A sub-macro control circuit 15 is formed along the memory block 13A, the DQB block 13B, and the memory block 13C, which constitute the sub-macro 13.

The two sub-macros 22 and 23 cascaded with the other I/O block 21 are also configured like the sub-macros 12 and 13. The sub-macro 22 has two memory blocks 22A and 22C, which are arranged, on one side and the other side of the DQB block 22B, and the sub-macro 23 has two memory blocks 23A and 23C which are arranged on one side and the other side of the DQB block 23B. The DQB blocks 22B and 23B are respectively connected to the I/O block 21 through the global data lines GDL. The DQB blocks 22B and 23B are connected to the memory blocks 22A, 22C, 23A, and 23C, via local data lines LDL, respectively. The sub-macros 22 and 23 are controlled in common with the sub-macros 12 and 13 by the sub-macro control circuits 14 and 15.

The I/O blocks 11 and 21 and the external circuit 10 are connected by plural data input lines DI and data output lines DO. The I/O blocks 11 and 21 have the latch circuit for data transmission to and data reception from the external circuit 10, and the latch operation will be described later with reference to FIG. 5.

At this point, the problems of the RC delay, logic delay, data skew, and clock skew in writing the write data in the sub-macros 12, 13, 22, and 23 from the external circuit 10 will be considered on the configuration shown in FIG. 4.

The write data supplied from the external circuit 10 to the I/O blocks 11 and 21 is selectively supplied to the DQB blocks 12B, 13B, 22B, and 23B respectively provided in the center of the sub-macros 12, 13, 22, and 23 through the global data lines GDL. For example, when the data is written in the sub-macro 12, the write data is supplied to the DQB block 12B, and then the write data is written in the memory block 12A or the memory block 12C through the local data lines DQt/c.

In the first embodiment in which the DQB block is commonly provided for the memory blocks on the both sides of the DQB block, the number of DQB blocks can be decreased and the resultant global data line length is shortened, when compared with the configuration shown in FIG. 1 in which the DQB block is provided for each memory block. This configuration enables the RC delay to be decreased in the global data lines. Because the connection line capacity of the global data lines is also suppressed, the first embodiment has advantages such as the miniaturization of the logic circuit, which drives the connection line and the decrease in logic delay. Further, skew decrease effect is also collaterally obtained as follows.

That is, although the memory block 12C is located farther than the memory block 12A when viewed from the I/O block 11, the distance between the I/O block 11 and the memory block 12C is equal to the distance between the I/O block 11 and the memory block 12A on a data bus because the write data is supplied from the I/O block 11 to each memory block after the write data is latched once by the DQB block 12B. Therefore, when compared with the case in which the data is written in the memory block 12A, the RC delay and the logic delay has no influence on the memory block 12C, and the skew problem is not also generated. The same holds in writing the data in sub-macros 13, 22, and 23. In the case where the data is read from the sub-macros 12, 13, 22, and 23 to the external circuit 10, the same advantages can obviously be obtained, however, only the flow direction of the data is reversed.

The internal configuration of the first embodiment will be described in detail with reference to FIG. 5 by taking the interface unit IF formed by the I/O blocks 11 and 21 and the I/O block control circuit 31, peripheral portions of the DQB blocks 13B and 23B in the sub-macros 13 and 23, and the sub-macro control circuit 15 as an example.

Figure 5:
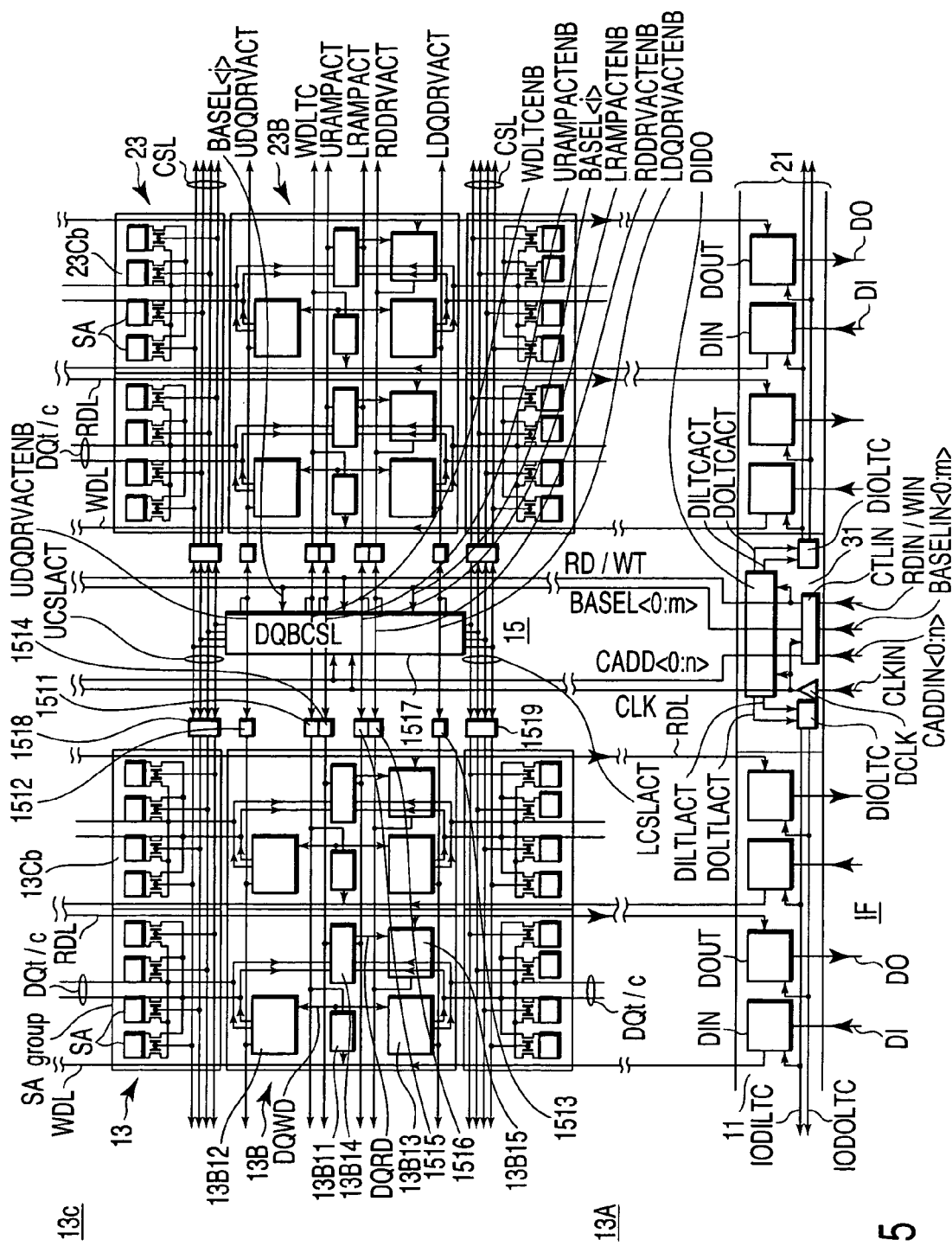
FIG. 5 is a block diagram explaining a part of FIG. 4 in detail.

In FIG. 5, a clock input CLKIN is supplied from the outside to a clock driver DCLK in the I/O block control circuit 31 in the interface unit IF. The clock driver DCLK receives the clock input CLKIN to generate an internal basic clock signal CLK of eDRAM.

A column address input signal CADDIN<0:n>, a bank address input signal BASELIN<0:m>, a read command input signal RDIN, and a write command input signal WTIN are supplied from the outside to a control signal input circuit CTLIN in the I/O block control circuit 31, and these signals are latched by the internal basic clock signal CLK to generate a column address signal CADD<0:n>, a memory block address selection signal BASEL<0:m>, and read and write command signals RD and WT.

Each of the I/O blocks 11 and 21 has the configuration in which plural write data latch circuits DIN and read data latch circuits DOUT are arrayed. The write data latch circuit DIN latches the external input data DI with a write data latch signal IODILTC generated by a data input/output latch driver DIOLTC provided in the I/O block control circuit 31, and the write data latch circuit DIN transmits the external input data DI to the write data line WDL which is of a part of the global data lines GDL. The read data latch circuit DOUT receives and latches the read data from eDRAM with a read data latch signal IODOLTC generated by the data input/output latch driver DIOLTC through the read data line RDL which is of a part of the global data lines GDL, and the read data latch circuit DOUT transmits the read data in the form of external output data DO to the external circuit 10 shown in FIG. 4.

The data input/output latch driver DIOLTC is prepared to each of the I/O blocks 11 and 21, and the data input/output latch driver DIOLTC is controlled by a commonly-provided data input/output control circuit DIDO. That is, in writing the data, the data input/output control circuit DIDO receives a write command WT to activate a write data latch activating signal DILTCACT in synchronization with the basic clock signal CLK. In reading the data, the data input/output control circuit DIDO receives a read command RD to activate an output data latch activating signal DOLTCACT in synchronization with the basic clock signal CLK. The activating signals DILTCACT and DOLTCACT are supplied from the data input/output control circuit DIDO to the two data input/output latch drivers DIOLTC to control the data latch circuits DOUT and DIN.

The sense amplifier (SA) blocks 13Cb and 23Cb located in the memory bank of the sub-macros 13 and 23 respectively have the configuration in which plural SA groups are arrayed. All SAs in a certain SA group are controlled by column selection lines (column address selection signal) CSL supplied to CSL gates on both one side or the other side of each of the DQB blocks 13B and 23B, and the data read and data write operations are performed to the common complementary local data signal line DQt/c. That is, one of the plural column address selection signals is supplied to each CSL gate in the SA group, only the CSL gate connected to the activated column address selection signal becomes the conduction state, and data read and write operation is performed between the selected SA and the complementary local data lines DQt/c.

Practically the DQB block in each sub-macro has the configuration in which the plural DQB circuits are arrayed. For example, the one DQB circuit provided for the pair of write and read data lines WDL and RDL in the DQB block 13B in the sub-macro 13 includes a both-side memory block shared write data latch circuit 13B11, a one-side driver 13B12, a other-side driver 13B13, a read amplifier circuit 13B14, and a read driver 13B15. The write data latch circuit 13B11 receives and latches the data from the I/O block 11 through the global data lines WDL. The one-side driver 13B12 supplies the data to the memory block 13C provided on one side of the DQB block 13B. The other-side driver 13B13 supplies the data to the memory block 13A provided on the other side of the DQB block 13B. The data read from the memory block 13C or 13A through the complementary local data lines DQt/c is commonly supplied to the read amplifier circuit 13B14 local data lines DQt/c in order to amplify the read data. The read driver 13B15 outputs the read data from the read amplifier circuit 13B14 to the I/O block 11 through the global data line RDL. Similarly other DQB circuits are configured for pairs of the write and read global data lines WDL and RDL respectively.

In each pair of global data lines WDL and RDL, the complementary local data lines DQt/c provided on the both sides of the DQB block 13B are connected to the driver circuits 13B12 to 13B15, and the complementary local data lines DQt/c are shared between the one-side memory block 13C and the other-side memory block 13A.

The write data latch circuit 13B11 is connected to the write global data line WDL, and the write data latch circuit 13B11 generates latch write data DQWD by latching the write data on the global data line WDL with a data latch signal WDLTC generated by a latch circuit driver 1511 provided in the sub-macro control circuit 15. The latched write data DQWD is supplied to the one-side write data driver 13B12 and the other-side write data driver 13B13, the one-side write data driver 13B12 and the other-side write data driver 13B13 transmit the latched write data DQWD through the local data lines DQt/c, and the latched write data DQWD is written in the memory block 13A or 13C assigned by the address data.

The one-side write data driver 13B12 and the other-side write data driver 13B13 are activated by a driver activating signal U/LDQDRVACT generated by driver activating drivers 1512 and 1513 which are provided in the sub-macro control circuit 15 corresponding to the write data drivers 13B12 and 13B13 respectively, and the write data drivers 13B12 and 13B13 transmit the write data DQWD to the complementary local data lines DQt/c. The write data transmitted onto the complementary local data lines DQt/c is supplied to the sense amplifier through the CSL gate connected to the activated signal line in the plural column address selection signal lines CSL, and the data is further written in the memory cell in the cell array selected in the memory blocks 13A and 13C.

The read amplifier circuit 13B14 in the DQB block 13B is connected to both the complementary local data lines DQt/c corresponding to the one-side memory block 13C and the complementary local data line DQt/c corresponding to the other-side memory block 13A. When activating signals URAMPACT and LRAMPACT generated by a one-side read amplifier activating driver 1514 and an other-side read amplifier activating driver 1515 in the sub-macro control circuit 15 respectively are supplied, the read amplifier circuit 13B14 captures, amplifies, and latches the read data on the complementary local data lines DQt/c. The latched read data DQRD is transmitted to the global data line RDL, and the read data DQRD is transmitted to the external circuit 10 through the I/O block 11. That is, the read data DQRD outputted from the read amplifier circuit 13B14 is transmitted to the driver 13B15, the driver 13B15 is activated by the activating signal RDDRVACT generated from a driver activating driver 1516 in the sub-macro control circuit 15, and the read data DQRD is transmitted onto the global data line RDL.

Thus, a DQBCSL control circuit 1517, both-side CSL drivers 1518 and 1519, the both-side activating drivers U/LDQDRVACT 1512 and 1513, the latch circuit driver 13B12, the amplifier activating drivers 1514 and 1515, the read driver activating driver 1516, and the like are arranged in the sub-macro control circuit 15.

The eDRAM internal basic clock CLK is supplied to the DQBCSL control circuit 1517, and the DQBCSL control circuit 1517 is operated in synchronization with the clock CLK. At that time, as shown in FIG. 5, the read command RD, the write command WT, a memory block selection signal BASEL<i> to which the other-side memory blocks 13A and 23A adjacent to the sub-macro control circuit 15 are allocated in the memory block selection signals BASEL<0: m>, a memory block selection signal BASEL<j> allocated to the one-side memory block are inputted to the DQBCSL control circuit 1517.

The internal configuration will be described more specifically. In reading the data, the DQBCSL control circuit 1517 receives the read command RD to activate an enable signal RDDRVACTENB in synchronization with the eDRAM internal basic clock CLK, and the driver activating signal RDDRVACT is generated from the driver 1516. At the same time, when the one-side memory blocks 13C and 23C are selected by the memory block selection signal BASEL<j>, an enable signal URAMPACTENB is activated to generate the activating signal URAMPACT from the driver 1514. On the other hand, when the other-side memory block 13A and 23A are selected by the memory block selection signal BASEL<i>, an enable signal LRAMPACTENB is activated to generate the amplifier activating signal LRAMPACT from the driver 1515.

In writing the data DQBCSL control circuit 1517 receives the write command WT to activate an enable signal WDLTCENB in synchronization with the eDRAM internal basic clock CLK, and the write latch signal WDLTC is generated from the driver 1511. At the same time, when the one-side memory blocks 13C and 23C are selected by the memory block selection signal BASEL<j>, an enable signal UDQDRVACTENB is activated to generate the activating signal UDQDRVACT from the driver 1512. On the other hand, when the other-side memory blocks 13A and 23A are selected by the memory block selection signal BASEL<i>, an enable signal LDQDRVACTENB is activated to generate the activating signal LDQDRVACT from the driver 1513.

Further, in both reading and writing the data, the DQBCSL control circuit 1517 receives the read command RD or the write command WT. When the memory block selection signal BASEL<j> is activate, the DQBCSL control circuit 1517 generates a driver activating signal UCSLACT to activate the driver 1518. When the memory block selection signal BASEL<i> is activated, the DQBCSL control circuit 1517 generates a driver activating signal LCSLACT to activate the driver 1519.

Then, an example of the specific circuit of the read amplifier circuit 13B14 shown in FIG. 5 will be described in detail with reference to FIG. 6. The read amplifier circuit 13B14 has the configuration in which the DQB block 13B is easily shared between the two memory blocks 13C and 13A connected on the both sides of the DQB block 13B.

Figure 6:
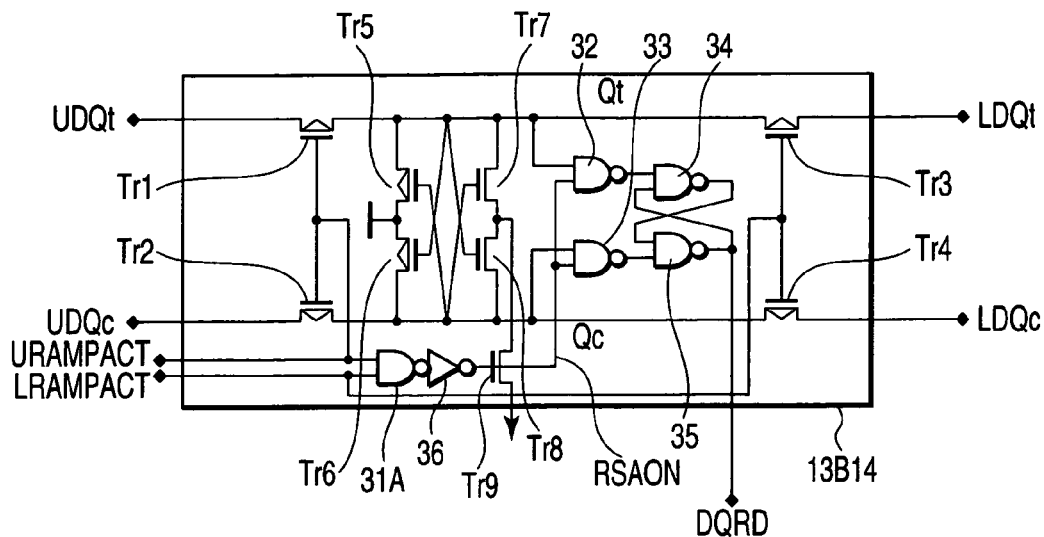
FIG. 6 is a block diagram showing a configuration of a read amplifier shown in FIG. 5.

In the pair of local data lines DQt/c connected to the DQB block 13B in FIG. 5, one of the local data lines DQt/c connected to the one-side memory block 13C is designated by a reference sign UDQt/c and the other-side local data lines DQt/c connected to the other-side memory block 13A is designated by a reference sign LDQt/c in FIG. 6. In FIG. 6, the local data line UDQt in the local data lines DQt/c is connected to one end of a P-channel transistor Tr1, and the local data line UDQc is connected to one end of a P-channel transistor Tr2. The other end of the transistor Tr1 is connected to the local data line LDQt through an internal data line Qt and a P-channel transistor Tr3. The other end of the transistor Tr2 is connected to the local data line LDQc through an internal data line Qc and a P-channel transistor Tr4. The gates of the transistors Tr1 and Tr2 are connected to each other, the one-side read amplifier activating signal URAMPACT is supplied to the connection point between the gates of the transistors Tr1 and Tr2, and the other-side read amplifier activating signal LRAMPACT is supplied to the connection point between the gates of the transistors Tr3 and Tr4.

While two P-channel sense transistors Tr5 and Tr6 are connected in series between the internal data lines Qt/c, two N-channel sense transistors Tr7 and Tr8 connected in series and this serially connected transistor circuit is connected in parallel with the transistor circuit of the transistors Tr5 and Tr6. The gates of the sense transistors Tr5 and Tr7 connected onto the internal data line Qt are commonly connected to the internal data line Qc. The gates of the sense transistors Tr6 and Tr8 are commonly connected to the internal data line Qt. The power supply voltage V is applied to the connection point between the sense transistors Tr5 and Tr6. The connection point between the sense transistors Tr7 and Tr8 is grounded through an N-channel transistor Tr9. The gate of the transistor Tr9 is connected to an output terminal of an inverter 36, and the input terminal of the inverter 36 is connected to the output terminal of a NAND circuit 31A. The one-side read amplifier activating signal URAMPACT and the other-side read amplifier activating signal LRAMPACT are supplied to input terminals of the NAND circuit 31A, respectively.

The output terminal of the inverter 36 is also connected to the input terminals of two NAND circuits 32 and 33. The other input terminal of the NAND circuits 32 and the other input terminal of the NAND circuits 33 are connected to the internal data lines Qt and Qc respectively. The output terminals of the NAND circuits 32 and 33 are connected to the input terminal of a flip-flop circuit FF formed by two NAND circuits 34 and 35, and read data DQRD is obtained from the output terminal of the flip-flop circuit FF.

In reading the data from the one-side memory block 13C or from the other-side memory block 13A, any one of the two read amplifier activating signals URAMPACT and LRAMPACT generated from the two drivers 1514 and 1515 shown in FIG. 5 is activated and becomes at the L-level. For example, when the data is read from the one-side memory block 13c, the read amplifier activating signal URAMPACT becomes at the L-level, which brings the P-channel transistors Tr1 and Tr2 in the conduction state to supply the read data on the one-side local data lines UDQt/c to the read amplifier circuit 13B14. At this point, since one of the inputs of the NAND circuit 31 becomes at the L-level, the output of the inverter 36 is changed to the L-level to bring the transistor Tr9 out of conduction. When the read amplifier activating signal URAMPACT becomes at the H-level, since both the inputs of the NAND circuit 31 become at the H-level, the output of the inverter 36 also becomes at the H-level. Therefore, the transistor Tr9 is brought in the conduction state, and the data read on the internal data lines Qt and Qc is amplified by the transistors Tr5 to Tr9.

The H-level output from the inverter 36 is supplied in the form of a read amplifier sense signal RSAON to the inputs of the NAND circuits 32 and 33. Therefore, the data amplified by the transistors Tr5 to Tr9 is latched through the NAND circuits 32 and 33 by the flip-flop circuit formed by the NAND circuits 34 35, and the data is outputted as the read data DQRD.

In reading the data from the other-side memory block 13A, the read amplifier activating signal LRAMPACT is activated to bring the P-channel transistors Tr3 and Tr4 in the conduction state, and the data read from the other-side memory block 13A is amplified through the transistors Tr3 and Tr4 by the amplifying circuit formed by the transistors Tr5 to Tr8. The amplified data is latched by the flip-flop circuit through the NAND circuits 32 and 33 and outputted as the read data DQRD.

Thus, the read amplifier circuit 13B14 shown in FIG. 6 selectively captures the read data from one-side memory block 13C or the read data from the other-side memory block 13A through the local data lines DQt/c according to the generated read amplifier activating signals URAMPACT and LRAMPACT. At the same time, the read amplifier sense signal RSAON is generated from OR logic between the read amplifier activating signals corresponding to both the memory blocks, and the amplified data is latched by the flip-flop circuit, which allows the read amplifier circuit 13B14 to be shared between the memory blocks on the both sides of the read amplifier circuit 13B14. Therefore, the amplification of the read data and the sharing of the read amplifier circuit can easily be realized while the complication of circuit for the latching is prevented.

Then, a method of allocating the bank address to the memory block in the first embodiment shown in FIG. 4 will be described in detail with reference to FIG. 7 to FIG. 10.

Figure 7:
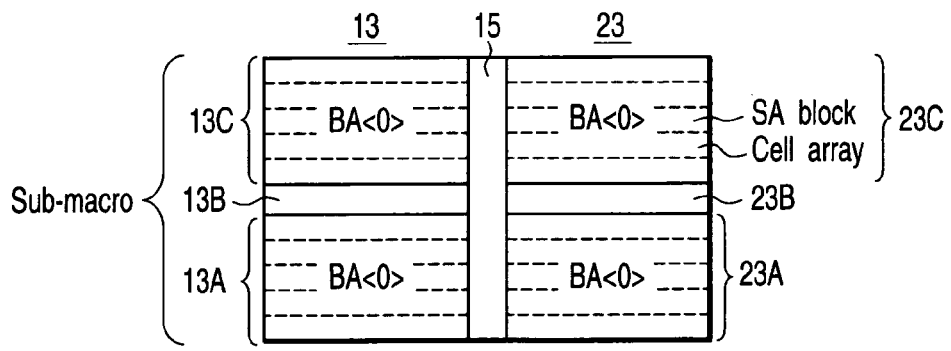
FIG. 7 shows an example of a bank address set in the embodiment of FIG. 4.

In the method shown in FIG. 7, the first sub-macro 13 and the second sub-macro 23 which are formed while the sub-macro control circuit 15 is sandwiched therebetween have the same bank address configuration, and a common bank address BA<0> is allocated to the memory blocks 13C, 13A, 23C, and 23A which are connected on the both sides of the DQB blocks 13B and 23B in the sub-macros 13 and 23 respectively. Namely, in the configuration, the DQB blocks 13B and 23B are arranged in a position where the memory blocks of the same scale are divided in the sub-macros 13 and 23. Therefore, the line lengths of the local data lines DQt/c connected on the both sides of the DQB blocks 13B and 23B can be decreased, and the line length difference can be minimized. The memory blocks 13C, 23C, . . . form a complex structure along with the SA blocks 13Cb, 23Cb, . . . which are provided in relation to the plural memory cell arrays 13Ca, 23Ca, . . . respectively. In the following descriptions, the memory block shall have the same structure.

Figure 8:
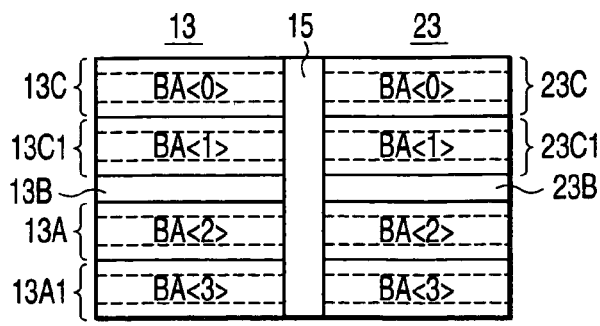
FIG. 8 shows another example of the set bank address.

In the method shown in FIG. 8, a bank address BA<1> is allocated to a memory block 13C1 while the memory block 13C1 is added on one side of the DQB block 13B. The memory block 13C1 has the same configuration as the memory block 13C to which the bank address BA<0> shown in FIG. 7 is allocated. The bank addresses BA<0> and BA<1> are also allocated to the memory block 23C while a memory block 23C1 having the same configuration is added onto the memory block 23C, which is formed across the sub-macro control circuit 15. Similarly bank addresses BA<2> and BA<3> are allocated on the other side of each of the DQB blocks 13B and 23B.

In the allocating method shown in FIG. 8, while the capacity of the memory block allocated to one DQB block is increased, the number of DQB blocks can be decreased because the local data lines DQt/c can be shared between the plural addresses, e.g., between the banks to the bank addresses BA<0> and BA<1> are allocated. Therefore, the line length of the global data line can be shortened. For example, as compared with the method shown in FIG. 7, the number of DQB blocks can be decreased in half in the method shown in FIG. 8 when the capacity of the macro memory and the number of bank addresses possessed by the memory macro are similar in both the methods shown in FIGS. 7 and 8.

Figure 9:
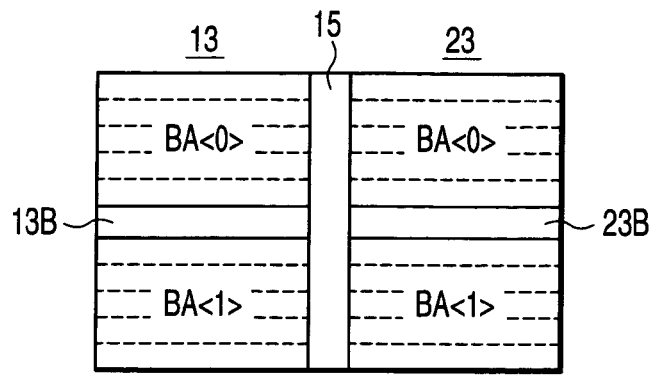
FIG. 9 shows still another example of the set bank address.

In the allocation method shown in FIG. 9, the different bank addresses BA<0> and BA<1> are allocated to the memory blocks on the both sides of the DQB block 13B, while the same bank addresses BA<0> and BA<1> are allocated to the memory blocks on the both sides of the sub-macro control circuit 15 shared between the memory blocks. In this case, as shown in FIG. 8, the different bank addresses BA<0> and BA<1> are also allocated to one DQB block 13B. Thus, the number of DQB blocks can be decreased by sharing one DQB block between the different address memory blocks, and the line length of the global data line connected from the external circuit to the DQB block can be shortened.

Figure 10:
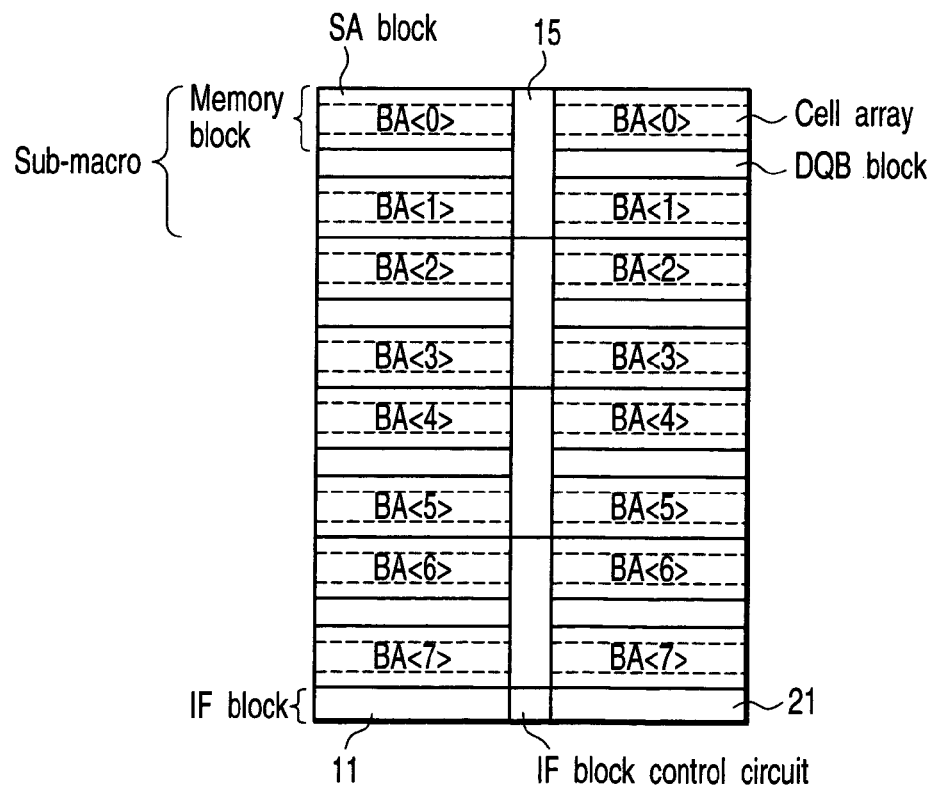
FIG. 10 shows still another example of the set bank address.

In the allocation method shown in FIG. 10, one bank address is allocated to one cell array. In FIG. 10, the eight cell arrays are arrayed on the I/O block 11 while bank addresses BA<7> to BA<0> are allocated to the cell arrays respectively, and the eight cell arrays are also arrayed on the I/O block 21 while bank addresses BA<7> to BA<0> are allocated to the cell arrays respectively.

As shown in FIG. 4 and FIG. 5, in the first embodiment, the global data line is divided into the data write line and the data read line, and each bank has the local data lines DQt/c. Therefore, in the memory blocks which do not share the same DQB block, the memory block can get access to the two different banks, and the memory block can perform the write operation in one bank while performing the read operation from the other bank.

Figure 11:
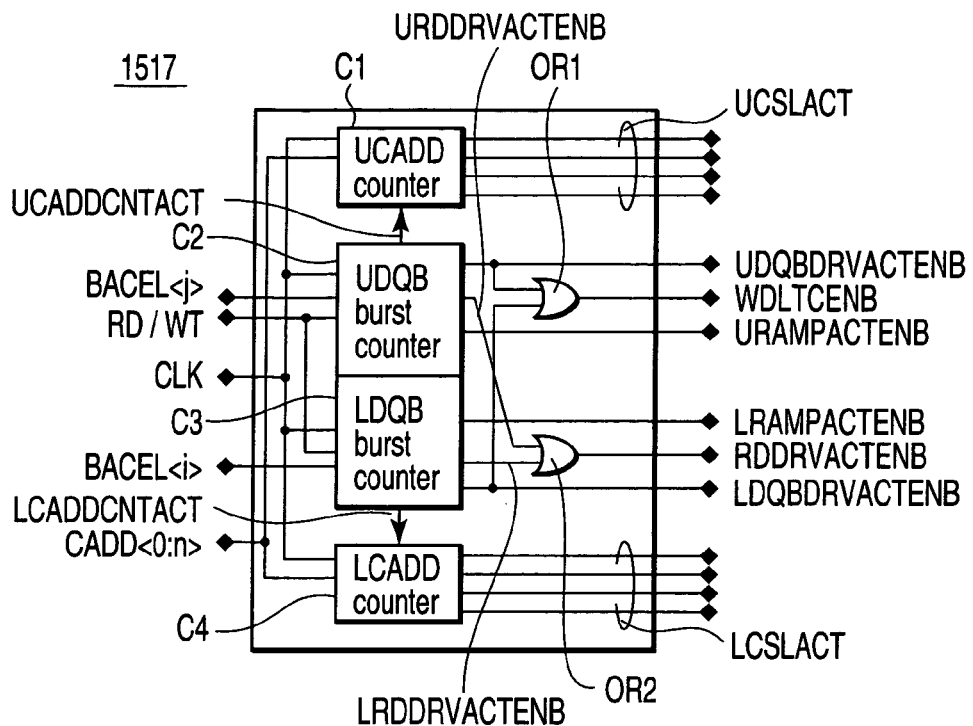
FIG. 11 is a block diagram showing a configuration of a DQBCSL control circuit shown in FIG. 5.

When the DQBCSL control circuit having the configuration shown in FIG. 11 is arranged in the sub-macro control circuit 15 of FIG. 10, even in the two banks which share the same DQB block, the memory block can perform the write operation in one bank while performing the read operation from the other bank.

The configuration and the operation of the DQBCSL control circuit 1517 shown in FIG. 5 will be described in detail with reference to FIG. 11. As described in FIG. 5, the one-side memory block selection signal BACEL<j>, the other-side memory block selection signal BASEL<i>, the read and write command signals RD/WT, the eDRAM internal basic clock CLK, and the column address signal CADD<0:n> are supplied to the DQBCSL control circuit 1517.

The DQBCSL control circuit 1517 includes four counters C1, C2, C3, and C4 and two OR gates OR1 and OR2. The eDRAM internal basic clock CLK is commonly supplied to the counters C1 to C4. The one-side memory block selection signal BACEL<j> and the other-side memory block selection signal BASEL<i> are respectively supplied to the counters C2 and C3 along with the read and write command signals RD/WT. The column address signal CADD<0:n> is connected so as to be supplied to the counters C1 and C4.

The counter C2 supplies an activating signal UCADDCNTACT to the counter C1 based on the one-side memory block selection signal BACEL<j> and the read and write command signals RD/WT. The counter C1 counts the column address signal CADD<0:n> according to the activating signal UCADDCNTACT to generate the activating signal UCSLACT for activating the driver 1518 as described in FIG. 5. As described later, the counter C2 outputs various signals including the signal supplied to the OR gates OR1 and OR2.

Similarly the counter C3 supplies an activating signal LCADDCNTACT to the counter C4 based on the other-side memory block selection signal BACEL<i> and the read and write command signals RD/WT. The counter C4 counts the column address signal CADD<0:n> according to the activating signal LCADDCNTACT to generate the activating signal LCSLACT for activating the driver 1519 as shown in FIG. 5. As described later, the counter C3 outputs various signals including the signal supplied to the OR gates OR1 and OR2.

The counter C2 is the circuit, which controls the DQB block 13B and DQB block 23B when the bank including the memory block 13C on one side of the DQB block 13B and DQB block 23B is selected. The counter C3 is the circuit, which controls the DQB block 13B and DQB block 23B when the bank including the memory blocks 13A and 23A on the other side is selected.

Figure 12:
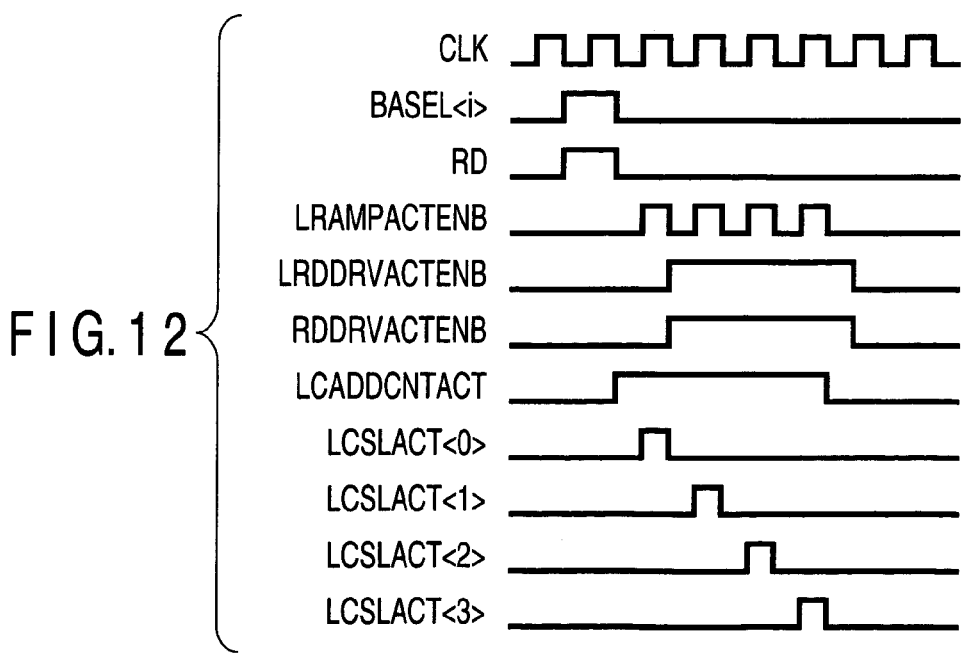
FIG. 12 is a timing chart explaining an operation of the control circuit shown in FIG. 11 in reading data.
Figure 13:
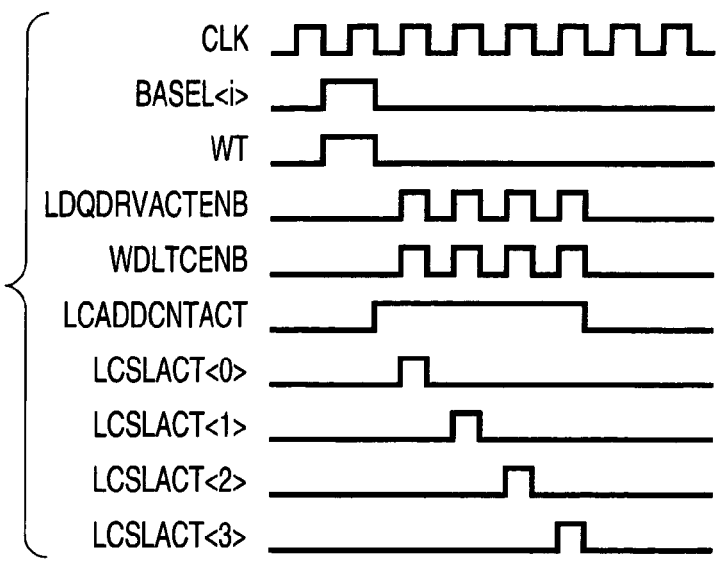
FIG. 13 is a timing chart explaining an operation of the control circuit shown in FIG. 11 in writing data.
Figure 14:
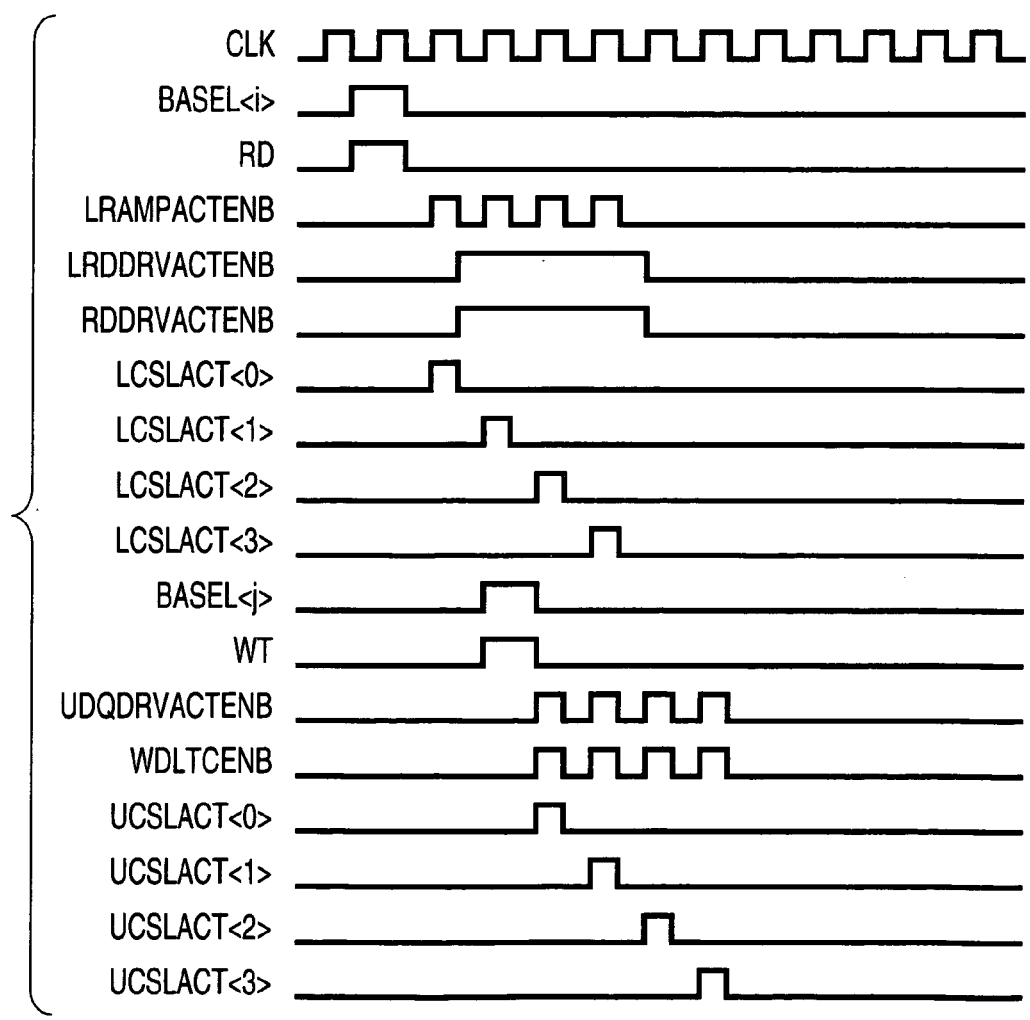
FIG. 14 is a timing chart explaining an operation of the control circuit shown in FIG. 11 in reading and writing data to/from upper and lower memory blocks.

Then, the operation of the DQBCSL control circuit 1517 in reading and writing the data will be described with reference to timing charts shown in FIG. 12 to FIG. 14. FIG. 12 shows the operation of the counter C3 when the bank on the other side of the DQB blocks 13B and 23B is selected in reading the data. In a read operation, when the selection signal BASEL<i> and the read command signal RD are activated, the counter C3 generates and outputs the enable signal LRAMPACTENB of a burst cycle number (in this case, four cycles of the clock CLK correspond to the burst cycle number) in synchronization with the eDRAM internal basic clock CLK. An interval enable signal LRDDRVACTENB corresponding to burst operation is also outputted. The enable signal LRDDRVACTENB is supplied to one of input terminals of the OR gate OR2. The OR gate OR2 receives any one of the enable signal LRDDRVACTENB and the enable signal URDDRVACTENB generated from the counter C2, and the OR gate OR2 outputs the enable signal RDDRVACTENB for reading the data.

The counter C3 also outputs a counter activating signal LCADDCNTACT of the interval corresponding to the burst operation by activating the read command signal RD and the selection signal BASEL<i>, and the counter C3 supplies the counter activating signal LCADDCNTACT to the counter C4. The counter C4 is activated by the counter activating signal LCADDCNTACT to count the column address signal CADD<0:n>, and the counter C4 sequentially outputs the driver activating signals LCSLACT<0> to LCSLACT<3> within the interval of the activating signal LCADDCNTACT.

Then, the operation C3 when the write command signal WT is supplied will be described with reference to FIG. 13. When the selection signal BASEL<i> and the write command signal WT are activated, the counter C3 generates and outputs the enable signal LDQDRVACTENB of the burst cycle number (in this case, four cycles of the clock CLK correspond to the burst cycle number) in synchronization with the eDRAM internal basic clock CLK. The enable signal LDQDRVACTENB is supplied to one of input terminals of the OR gate OR1. The OR gate OR1 receives any one of the enable signal LDQDRVACTENB and the enable signal UDQBDRVACTENB generated from the counter C2, and the OR gate OR1 outputs the enable signal WDLTCENB for writing the data.

The counter C3 also outputs a counter activating signal LCADDCNTACT of the interval corresponding to the burst operation by activating the write command signal WT and the selection signal BASEL<i>, and the counter C3 supplies the counter activating signal LCADDCNTACT to the counter C4. The counter C4 is activated by the counter activating signal LCADDCNTACT to count the column address signal CADD<0:n>, and the counter C4 sequentially outputs the driver activating signals LCSLACT<0> to LCSLACT<3> within the period of the activating signal LCADDCNTACT.

In the DQBCSL control circuit 1517 shown in FIG. 11, for example, the counter C2 can perform a write operation control to one of the banks while the counter C3 controls the read operation of the other bank. The operation will be described below with reference to FIG. 14.

When the bank on the other side of the DQB block 13B is selected, the counter C3 is the circuit, which controls the DQB block 13B, and the selection signal BASEL<i> is inputted to the counter C3. The counter C3 outputs the counter activating signal LCADDCNTACT while outputting the enable signals LRAMPACTENB, LRDDRVACTENB, and RDDRVACTENB according to the read command signal RD. The counter C4 is activated by the counter activating signal LCADDCNTACT to count the column address signal CADD<0:n>, and the counter C4 sequentially outputs the driver activating signals LCSLACT<0> to LCSLACT<3> within the period of the counter activating signal LCADDCNTACT.

When the one-side bank is selected to supply the write command signal WT, the counter C2 outputs the counter activating signal UCADDCNTACT while outputting the enable signals UDQDRVACTENB and WDLTCENB. The counter C1 is activated by the counter activating signal UCADDCNTACT to count the column address signal CADD<0:n>, and the counter C1 sequentially outputs the driver activating signals UCSLACT<0> to UCSLACT<3> within the period of the counter activating signal UCADDCNTACT. Thus, the counters C1 and C2 can control the write operation while the counters C4 and C3 perform the read operation. In the reverse case, the control can be performed in the similar way. In this manner, the DQB blocks 13B and 23B are controlled as the shared DQB block by the two counter C2 and C3 corresponding to each of the banks on the both sides of the DQB blocks 13B and 23B, and the column selection lines CSL of the bank are controlled by the counter C1 and C4 corresponding to the banks respectively, which allows the read and write operations to be performed between the banks which share the DQB block.

Figure 15:
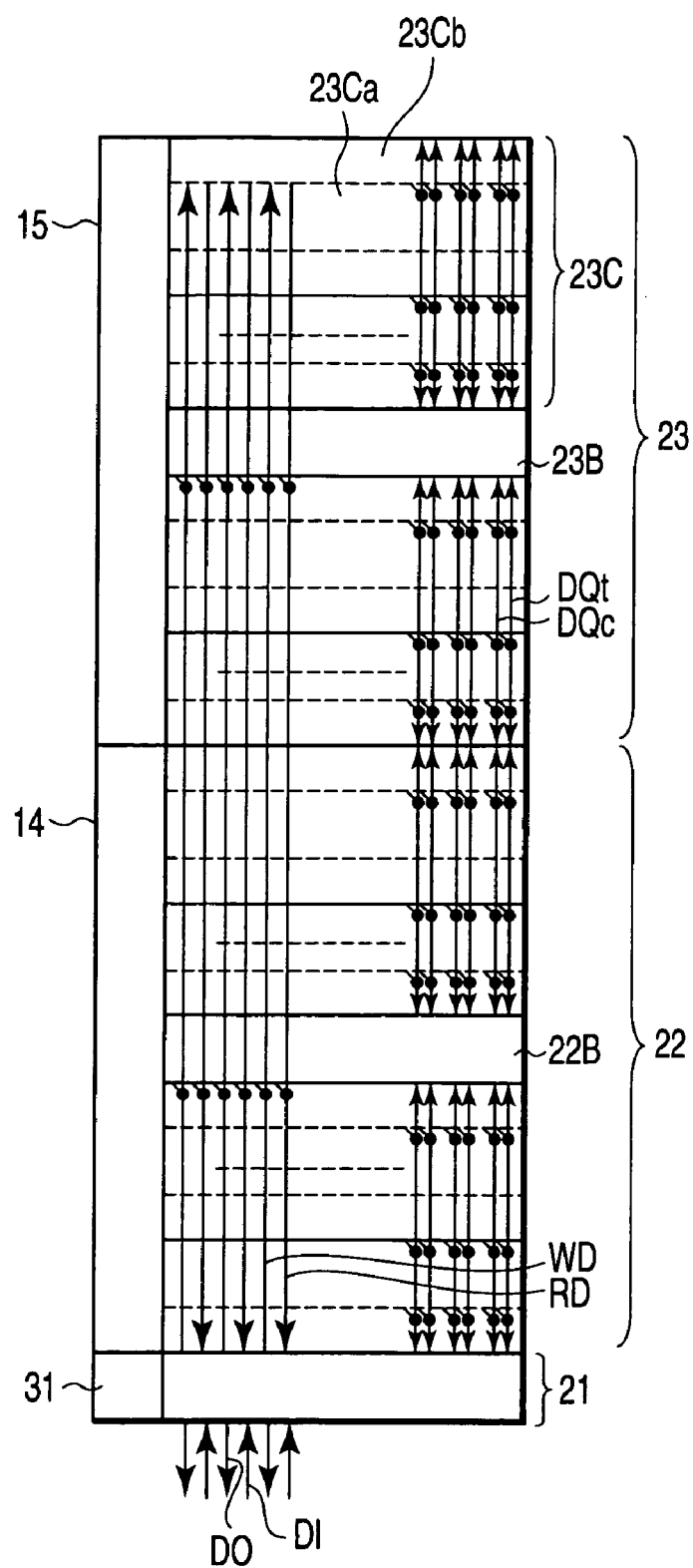
FIG. 15 is a block diagram showing a modification of the embodiment of FIG. 4.

In the first embodiment shown in FIG. 4, the plural sub-macros 12, 13, 22, and 23 are arranged with respect to the two I/O blocks 11 and 21, and the shared sub-macro control circuits 14 and 15 are located between the sub-macros 12 and 13 and the sub-macros 22 and 23. As shown in FIG. 15, a modification of the first embodiment can be also configured. That is, the plural sub-macros 22 and 23 are arranged in line with respect to the one I/O block 21, and the sub-macro control circuits 14 and 15 are associated with the sub-macros 22 and 23. In the modification of FIG. 15, the components corresponding to the first embodiment of FIG. 4 are designated by the same reference numerals and signs, so that the detailed description will be omitted.

As described above, according to the first embodiment, there is provided the semiconductor memory device in which the problem of the RC delay caused by the line length of the data line such as the global data line and the local data line is reduced to achieve the high speed and the large capacity of, e.g., eDRAM formed by stacking the sub-macros.

Second Embodiment

A second embodiment having a configuration, in which the RC delay is reduced by inserting a redriver into the global data line in addition to the configuration of the first embodiment, will be described below. Accordingly, the components corresponding to the first embodiment are designated by the same reference numerals and signs as the first embodiment, and the description will be omitted.

Figure 16:
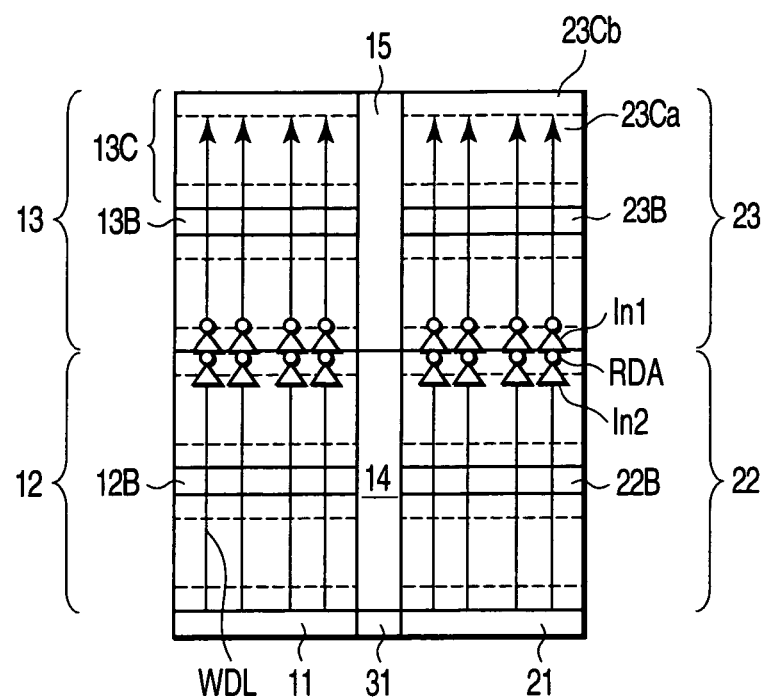
FIG. 16 is a block diagram showing a second embodiment of the present invention.

In the second embodiment shown in FIG. 16, a redriver RDA formed by a serial circuit of two inverters In1 and In2 is serially inserted into the global data line GDL such as each of the write data lines WDL at a boundary portion of arbitrary memory blocks arranged in the first embodiment shown in FIG. 4, e.g., at the boundary portion between the two sub-macros 12 and 13 and boundary portion between the sub-macros 22 and 23. In addition to the effect obtained by the first embodiment of FIG. 4, various errors caused by the RC delay of the data transmitted through the data line WDL in writing the data can be prevented further effectively by inserting the redriver RDA into the write data line WDL.

The second embodiment can also obviously be applied to the circuit mode of the reference example shown in FIG. 1 to FIG. 3.

Third Embodiment

Figure 17:
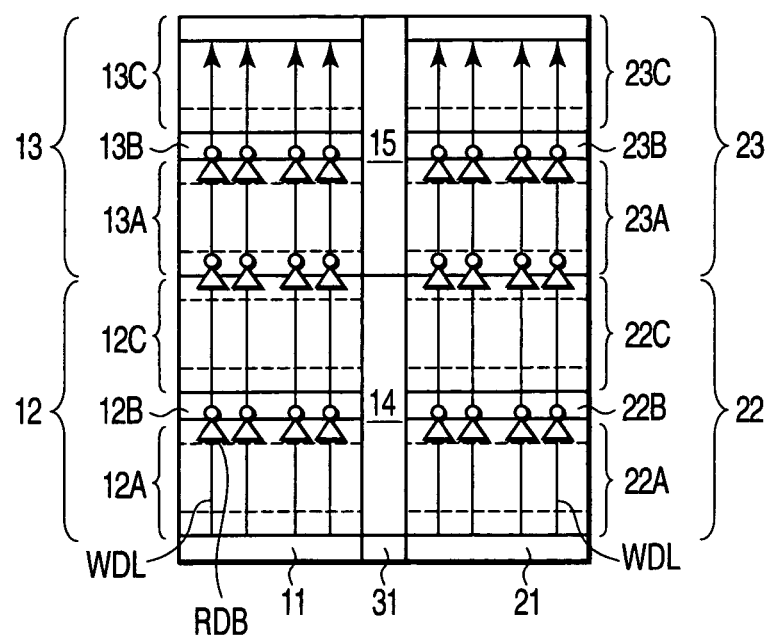
FIG. 17 is a block diagram showing a third embodiment of the present invention.

As shown in FIG. 17, in addition to the boundary portion between the sub-macros 12 and 13 and the boundary portion between the sub-macros 22 and 23, the redrivers can be provided on the global data lines GDL at the boundary portions between the memory blocks in each of the sub-macros 12, 13, 22, and 23 respectively by modifying the second embodiment of FIG. 16. In the third embodiment shown in FIG. 17, at the boundary portions in the sub-macros 12, 13, 22, and 23, redrivers RDB formed by the one inverter are provided on the write data line WDL which is of the global data line respectively. The redriver RDB formed by the one inverter is also provided on the write data line WDL at the boundary portion between the memory block and each of the DQB blocks 12B, 13B, 22B, and 23B. Therefore, similarly to the second embodiment of FIG. 16, the same delay compensation effect is obtained for the write data transmitted from the I/O blocks 11 and 21 through each global data lines GDL.

The third embodiment can also obviously be applied to the configuration shown in FIG. 1, in which the DQB block is provided for each memory block.

For the write data line WDL in the global data line GDL, as shown in FIG. 16 or FIG. 17, the redrivers having the same functions are equally inserted into all the write data lines WDL, which allows the influence of the interconnection delay to be reduced. However, for the read data line RDL, due to the difference in circuit operation state between the read driver in the selected DQB block and the read driver in the non-selected DQB block, the delay reduction effect is not obtained, even if the redrivers are simply evenly placed on the read data lines.

Fourth Embodiment

Figure 18:
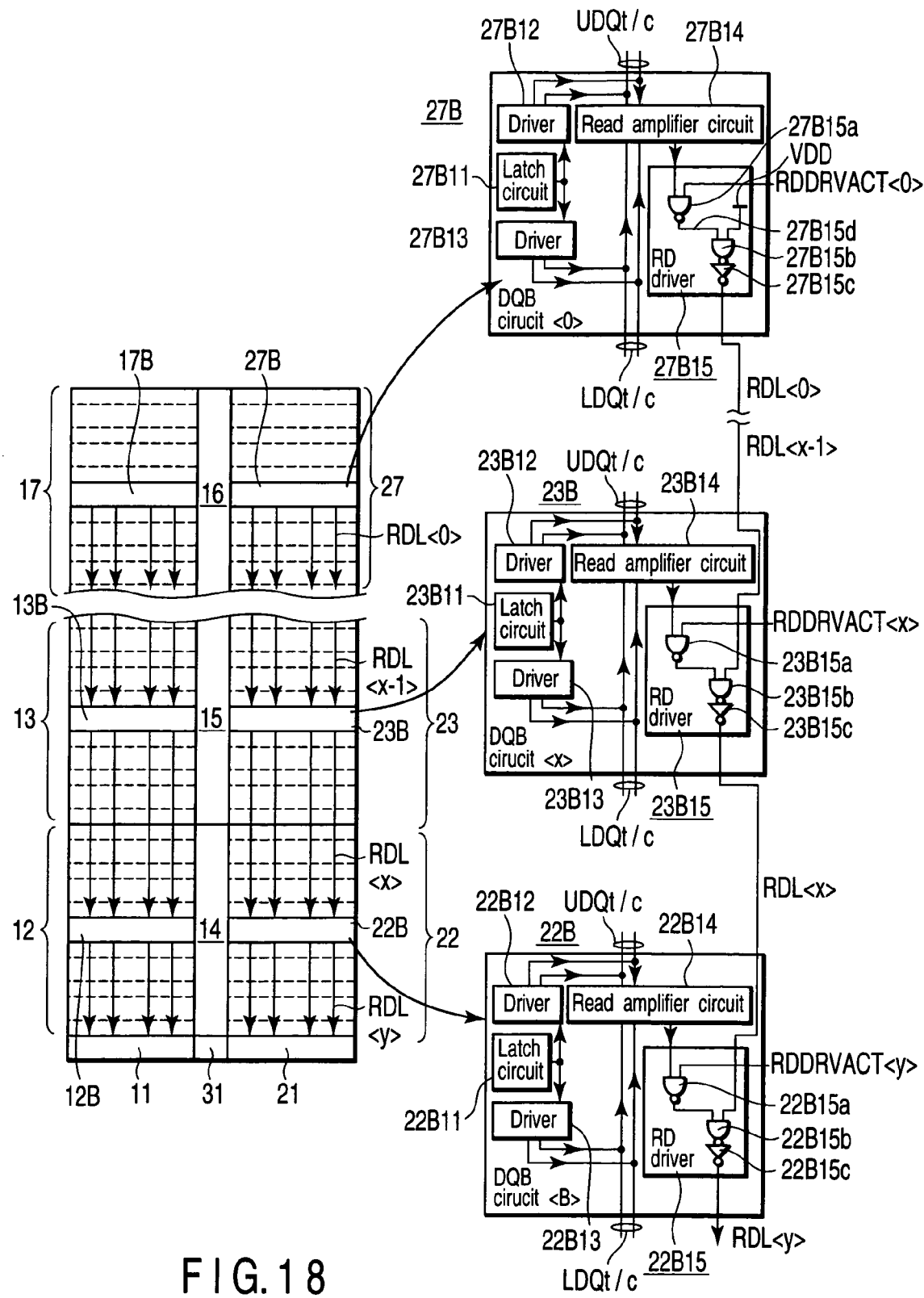
FIG. 18 is a block diagram showing a fourth embodiment of the present invention.

FIG. 18 is a circuit configuration showing a fourth embodiment in which the delay reduction effect is obtained for the read data line RDL. The basic structure of the memory array in the fourth embodiment is similar to the first embodiment of FIG. 4. Therefore, the components corresponding to the first embodiment are designated by the same reference numerals and signs as the first embodiment, and the description will be omitted. In the fourth embodiment shown in FIG. 18, the read driver 13B15 provided in the DQB block 13B of FIG. 5 is utilized as the redriver provided with respect to the read data line RDL, and the read data line RDL is divided by the read drivers in the DQB blocks to reduce the RC delay. Many circuits are provided in the DQB block 13B as shown in FIG. 5. However, the configurations other than the read driver 13B15, the control signals, and the like are nothing to do with the operation for the purpose of the fourth embodiment. Therefore, the rest will be omitted in FIG. 18.

In FIG. 18, the plural sub-macros 12, 13, . . . , 17 are sequentially cascaded with the I/O block 11. Similarly the plural sub-macros 22, 23, . . . , 27 are sequentially arranged with respect to the I/O block 21. The sub-macro control circuits 14, 15, . . . , 16 are formed between sub-macros 12 and 22, 13 and 23, . . . , 17 and 27 respectively. The sub-macros 12, . . . , 17 and 22, . . . 27 include the DQB blocks 12B, . . . , 17B and 22B, . . . 27B respectively.

The internal configurations of the DQB blocks 22B, 23B, and 27B are shown on the right side of FIG. 18. The DQB blocks basically have the same configuration as the DQB block 13B described in detail in FIG. 5.

In FIG. 18, the DQB block 22B includes a latch circuit 22B11, a one-side driver 22B12 and the other-side driver 22B13, one-side complementary local data lines DQt/c and other-side complementary local data lines LDQt/c, a read amplifier circuit 22B14, and an RD driver 22B15. The latch circuit 22B11 is connected to the write data line (not shown). The data latched by the latch circuit 22B11 is supplied to the one-side driver 22B12 and the other-side driver 22B13. The pieces of output data of the drivers 22B12 and 22B13 are supplied to the one-side complementary local data lines UDQt/c and the other-side complementary local data lines LDQt/c. The complementary local data lines UDQt/c and LDQt/c are commonly connected to the read amplifier circuit 22B14. The output of the read amplifier circuit 22B14 and the output of the one-side RD driver 23B15 are supplied to the RD driver 22B15.

The RD driver 22B15 includes two NAND gates 22B15a and 22B15b and one inverter 22B15c. One of inputs of the NAND gate 22B15a is the output of the read amplifier 22B14, and the other input is an RD driver activating signal RDDRVACT<y>. The activating signal RDDRVACT<y> is supplied from the driver 1516 of FIG. 5. The output of the NAND gate 22B15a and the output from the RD driver 23B15 of the one-side sub-macro 23 are supplied to the NAND gate 22B15b, and the output of the NAND gate 22B15b is outputted to RDL<y> after inverted by the inverter 22B15c.

When the DQB block 22B is not selected, because the RD driver activating signal RDDRVAGT<y> becomes the L-level, the output of the NAND gate 22B15a becomes the H-level irrespective of the output of the read amplifier circuit 22B14. Therefore, the NAND gate 22B15b receives the output, transmitted on RDL<x>, from the DQB block of the one-side sub-macro 23B, and the output is inverted by the inverter 22B15c and transmitted to RDL<y>. That is, the RD driver 22B15 redrives the read data on RDL<x> and transmits the read data to RDL<y>. On the other hand, when the DQB block 22B is selected, because the RD driver activating signal RDDRVACT<y> becomes the H-level, the NAND gate 22B15a receives the output of the read amplifier circuit 22B14 and transmits the output to the NAND gate 22B15b. At this point, for the later-described reason, because the output inputted to the NAND gate 22B15b from the DQB block 23B is in the H-level, the output transmitted to the NAND gate 22B15b from the read amplifier circuit 22B14 is transmitted from the inverter 22B15c to RDL<y>. That is, the RD driver 22B15 drives the read data from the corresponding memory block to RDL<y>.

The DQB blocks 23B and 27B are configured in the same way. Therefore, the same components are designated by the corresponding reference numerals and signs, and the detailed description will be omitted.

In FIG. 18, it is assumed that the DQB block <x>23B is selected. In this case, the DQB block <0>27B located farthest from the I/O block 21 is not selected. As described above, the RD driver of the non-selected DQB block redrives the output of the RD driver of the fore-step sub-macro. However, since the outside sub-macro does not exist in the farthest sub-macro 27, the RD driver 27B15 in the DQB block 27B is configured such that a power supply voltage VDD is supplied to one of the inputs of the NAND gate 27B15b. The H-level by the power supply voltage VDD is outputted to RDL<0> and sequentially redriven by the non-selected DQB blocks <1 to x−1>, and the H-level is transmitted to DQB block <x>23B through RDL<0 to x−1>.

The H-level by the redriven power supply voltage VDD is supplied to the NAND gate 23B15b of the selected DQB block <x>23B through RDL<x−1>. At this point, since the RD driver activating signal RDDRVACT<x> is activated to be in the H-level, the NAND gate 23B15a is opened, and the read data outputted from the read amplifier circuit 23B14 onto the local data lines UDQt/c or LDQt/c is supplied to the NAND gate 23B15b. Similarly, since the NAND gate 23B15b is opened, the read data is transmitted from the inverter 23B15c to RDL<x>.

Because the DQB block <y>22B on the post-step side is not selected, the read data on RDL<x> is redriven by the RD driver 22B15 of the DQB block <y>22B and transmitted to RDL<y>, and then the read data is transmitted to the I/O block 21.

Thus, the function of the RD driver in each DQB block is selected by the state of the activating signal RDDRVACT, namely, whether the RD driver is operated as the read data drive circuit of the corresponding sub-macro or the RD driver is operated as the read data redrive circuit of the fore-step DQB block is distinguished by the state of the activating signal RDDRVACT, which allows the RD driver circuit to have the function of redriving the read data line without complicating the configuration.

The fourth embodiment can also obviously be applied to both the reference example shown in FIG. 1 in which the DQB block is provided for each memory block and the modification shown in FIG. 15 in which the sub-macro is arranged only on one side of the sub-macro control circuit.

Fifth Embodiment

When the capacity of eDRAM is increased to increase its length in the data line direction, the interface unit which is of the circuit which the global data signals RD/WD are inputted to and outputted from and each data control unit are arranged in a wide range, which increases the skew in the data line direction of an eDRAM internal synchronous clock CLK to which these circuits are synchronous or the logic delay skew of each control circuit caused by power supply voltage drop in the data line direction. As a result, besides the increase in RC delay of the data line, the increase in skew generates the skew among various control signals concerning the data line control to prevent the high-speed read/write operation through the global data line.

The fifth embodiment has a configuration in which the skew can be reduced among the control signals in the interface unit and each data control unit. In the fifth embodiment, clock skew in the data line direction is reduced by hierarchization (tree structure) of a supply path of the eDRAM internal basic synchronous clock CLK. Further, three systems of the eDRAM internal synchronous clock are prepared to directly input the treelike clock to each control signal driver. Therefore, the number of logic steps from the treelike clock to each control signal is minimized, and the skew caused by the logic delay in each control circuit is also reduced. The three systems of the eDRAM internal synchronous clock include the system corresponding to the control signal driver which deals with the I/O block on the left side of each control circuit of the sub-macro, the DQB block, and the memory block, the system corresponding to the control signal driver which deals with the right-side I/O block, the DQB block, and the memory block, and the system corresponding to the memory block control circuit, the DQBCSL control circuit, and the data input/output control circuit which are of the control circuit unit in the central portion.

Figure 19:
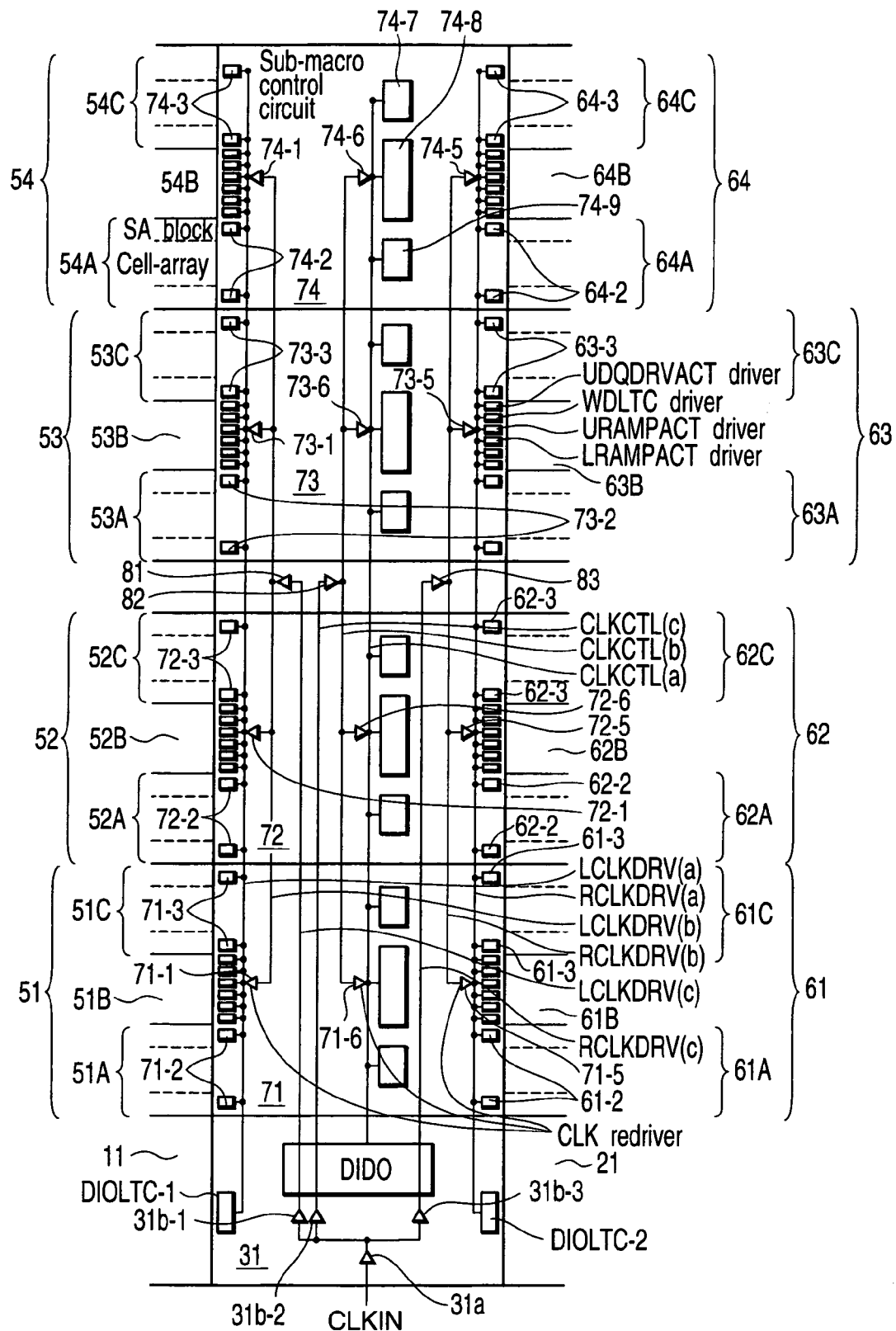
FIG. 19 is a block diagram showing a fifth embodiment of the present invention.

Then, the fifth embodiment will be described in detail with reference to FIG. 19 to FIG. 22. The entire configuration shown in FIG. 19 is similar to that shown in FIG. 4. Sub-macros 51, 52, 53, and 54 and sub-macros 61, 62, 63, and 64 are sequentially cascaded on the two I/O blocks 11 and 21 respectively. An I/O block control circuit 30 is formed between the I/O blocks 11 and 21, and sub-macro control circuits 71, 72, 73, and 74 are sequentially formed on one side of the I/O block control circuit 30.

The I/O block control circuit 31 includes a clock driver 31a, three clock redrivers 31b-1, 3b-2, and 31b-3, a data input/output control circuit DIDO, and a data input/output latch driver DIOLTC. The external clock input CLKIN is supplied to the clock driver 31a. The three clock redrivers 31b-1, 3b-2, and 31b-3 divide the output of the clock driver 31a into three-system clocks.

The outputs of the clock redrivers 31b-1 to 31b-3 are connected to clock redrivers 81, 82, and 83, which are formed in a boundary region of the sub-macro control circuits 72 and 73 at the midpoint of the sub-macro control circuits 71 to 74. The output of the clock redriver 81 is supplied to clock redrivers 71-1, 72-1, 73-1, and 74-1, which are formed for the left-side sub-macros 51 to 54 respectively. The outputs of the clock redrivers 71-1 to 74-1 are supplied to other-side CSL drivers 71-2 to 74-2 provided corresponding to other-side memory blocks 51A to 54A, one-side CSL drivers 71-3 to 74-3 provided corresponding to one-side memory blocks 51C to 54C, and plural drivers formed corresponding to DQB blocks 51B to 54B. The outputs of the clock redrivers 71-1 to 74-1 are also supplied to a data input/output latch driver DIOLTC-1 provided corresponding to the I/O block 11. These drivers are formed corresponding to the drivers shown in FIG. 5 respectively.

The output of the clock redriver 83 is supplied to clock redrivers 71-5 to 74-5 which are similarly formed for the right-side sub-macros 61 to 64. The outputs of the clock redrivers 71-5 to 74-5 are supplied to other-side CSL drivers 61-2 to 64-2 which are provided corresponding to other-side memory blocks 61A to 64A formed in the sub-macros 61 to 64, one-side CSL drivers 61-3 to 64-3 provided corresponding to one-side memory blocks 61C to 64C, and the plural drivers formed in DQB blocks 61B to 64B. The outputs of the clock redrivers 71-5 to 74-5 are also supplied to a data input/output latch driver DIOLTC-2 provided corresponding to the I/O block 21.

The output of the clock redriver 82 is supplied to clock redrivers 71-6, 72-6, 73-6, and 74-6 which are formed for the sub-macro control circuits 71 to 74 respectively. The output of the clock redriver 74-6 is supplied to a one-side memory block control circuit 74-7, the other-side memory block control circuit 74-9, and a DQBCSL control circuit 74-8 in the sub-macro control circuit 74. The other sub-macro control circuits 71 to 73 are formed in the same way.

In FIG. 19, the external clock input CLKIN received by the clock driver 31a is transmitted to a left-side clock line LCLKDRV(c), a control circuit clock line CLKCTL(c), and a right-side clock line RCLKDRV(c) through clock redrivers 31b-1 to 31b-3 arranged in the I/O block control circuit 31. Then, the external clock input CLKIN is supplied to the clock redrivers 81 to 83 arranged in the center portion in the data line direction of eDRAM. The output clocks of the clock redrivers 81 to 83 are distributed to the clock redrivers 71-1 to 74-1, 71-6 to 74-6, and 71-5 to 74-5 through a left-side clock drive line LCLKDRV(b), a control circuit clock line CLKCTL(b), and a right-side clock drive line RCLKDRV(b). The outputs of the redrivers 71-1 to 74-1, 71-6 to 74-6, and 71-5 to 74-5 are finally supplied to a left-side clock drive line LCLKDRV(a), a control circuit clock line CLKCTL(a), and a right-side clock drive line RCLKDRV(a) respectively.

The three left-side clock drive lines LCLKDRV(a), LCLKDRV(b), and LCLKDRV(c) constitute the clock tree structure for the control signal drivers which deal with the I/O block 11 on the left side of each control circuit and the sub-macros 51 to 54. The three clock drive lines RCLKDRV(a), RCLKDRV(b), and RCLKDRV(c) constitute the clock tree for the control signal drivers which deal with the I/O block 21 on the right side of each control circuit and the sub-macros 61 to 64. The three clock drive lines CLKCTL(a), CLKCTL(b), and CLKCTL(c) constitute the clock tree corresponding to each control circuit in the center portion.

Any one of the clock trees has the circuit configuration in which the clock-signal skew reduction effect is enhanced between the I/O block control circuit 31 and the sub-macro control circuits 71 to 74.

Figure 20:
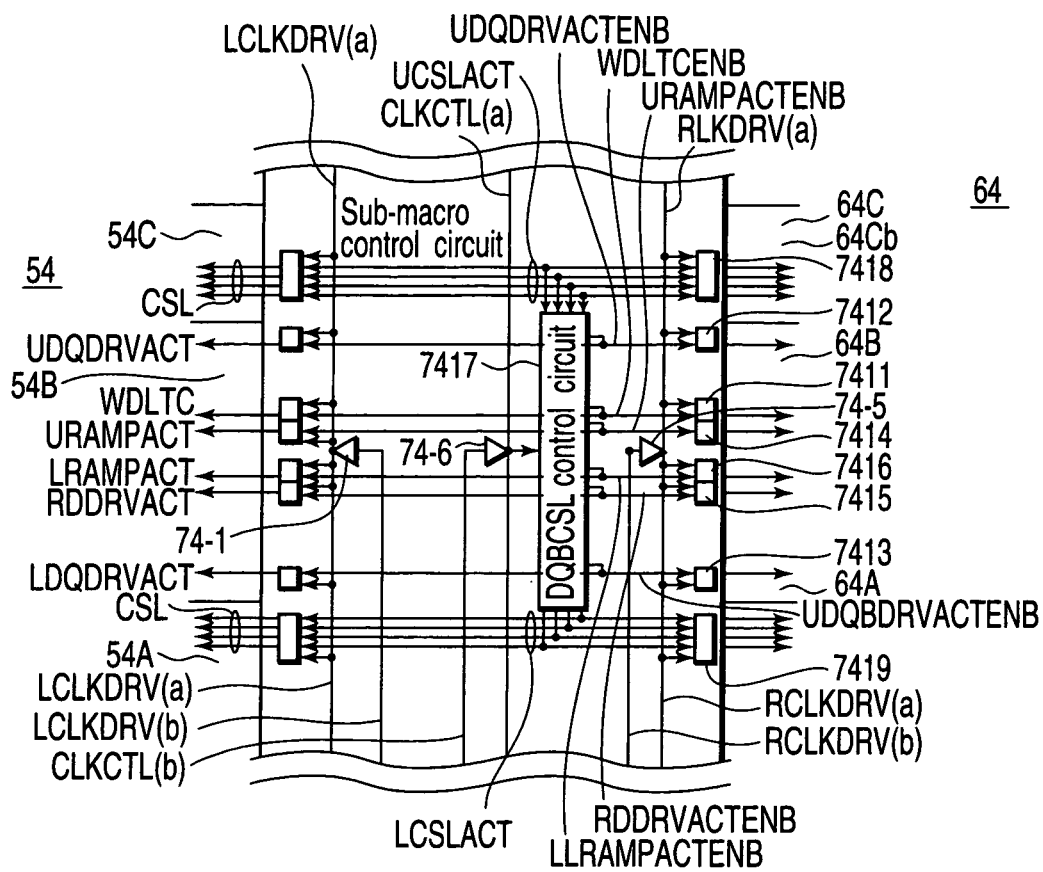
FIG. 20 is a block diagram showing a part of the embodiment of FIG. 19 in detail.

FIG. 20 is a block diagram showing an example of the detailed configuration of the DQBCSL control circuit and the associated portions inside the sub-macro control circuits 71 to 74 shown in FIG. 19. The configuration shown in FIG. 20 is similar to that shown in FIG. 4, so that the corresponding component is designated by the reference numeral and sign identical or similar to that shown in FIG. 5. However, the circuit of FIG. 20 differs from the circuit of FIG. 5 in the clock-signal supply path. When the sub-macro control circuit 74 is taken as an example, the connection of the clock drive lines LCLKDRV(a), LCLKDRV(b), CLKCTL(a), CLKCTL(b), RCLKDRV(a), and RCLKDRV(b) has the clock tree configuration as described in FIG. 19, and the clock drive lines LCLKDRV(a) and RCLKDRV(a) are directly inputted to the drivers provided on the right and left sides of the sub-macro control circuit 74.

The sub-macro control circuit 74 includes a DQBCSL control circuit 7417, CSL drivers 7418 and 7419, activating drivers 7412 and 7413, amplifier activating drivers 7414 and 7416, and a read driver activating driver 7415. The eDRAM internal basic clock CLK is supplied to the DQBCSL control circuit 7417 through the clock drive line CLKCTL(a) in which the tree structure of the eDRAM internal basic clock CLK is formed. The DQBCSL control circuit 7417 is operated in synchronization with the clock from the treelike clock drive line CLKCTL(a).

The sub-macro control circuit 74 will be described more specifically. In reading the data, the DQBCSL control circuit 7417 receives the read command RD to activate the enable signal RDDRVACTENB in synchronization with the clock on the clock drive line CLKCTL(a) in which the tree structure of the treelike eDRAM internal basic clock CLK is formed. The DQBCSL control circuit 7417 causes the driver 7415 to generate the driver activating RDDRVACT. At the same time, when the one-side memory blocks 54C and 64C are selected by the memory block selection signal, the enable signal URAMPACTENB is activated, and the activating signal URAMPACT is generated from the driver 7414. On the other hand, when the other-side memory blocks 54A and 64A are selected by the memory block selection signal, the enable signal LRAMPACTENB is activated, and the amplifier activating signal LRAMPACT is generated from the driver 7416.

In writing the data, the DQBCSL control circuit 7417 receives the write command WT to activate the enable signal WDLTCENB in synchronization with the eDRAM internal basic clock CLK, and the write latch signal WDLTC is generated from the driver 7411. At the same time, when the one-side memory blocks 54C and 64C are selected by the memory block selection signal, the enable signal UDQDRVACTENB is activated, and the activating signal UDQDRVACT is generated from the driver 7412. On the other hand, when the other-side memory blocks 54A and 64A are selected by the memory block selection signal, the enable signal LDQDRVACTENB is activated, and the activating signal LDQDRVACT is generated from the driver 7413.

Further, in both reading and writing the data, the DQBCSL control circuit 7417 receives the read command RD or the write command WT. When the one-side memory blocks 54C and 64C are activated by the memory block selection signal, the driver activating signal UCSLACT is generated to activate the driver 7418. When the other-side memory blocks 54A and 64A are activated by the memory block selection signal, the driver activating signal LCSLACT is generated to activate the driver 7419.

Figure 21:
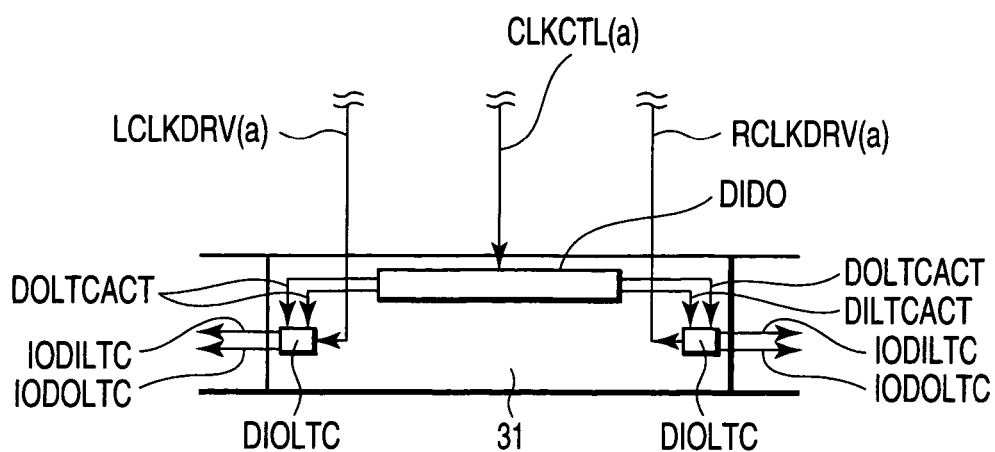
FIG. 21 is a block diagram showing an inner configuration of an I/O block control circuit connected to the circuit shown in FIG. 20.

FIG. 21 is a block diagram showing an example of the detailed internal configuration concerning the I/O block control circuit 31 and the associated portions. The I/O block control circuit 31 receives the signals from the clock control line CLKCTL(a), the left-side clock drive line LCLKDRV(a), the right-side clock drive line RCLKDRV(a) which are shown in FIG. 20. The circuit configuration shown in FIG. 21 is similar to the circuit 31 shown in FIG. 5, the portion associated with the control of the right and left I/O blocks is extracted, and the corresponding components are designated by the reference numerals and signs identical or similar to that shown in FIG. 5. The circuit configuration shown in FIG. 21 includes the data input/output control circuit DIDO and the two drivers DIOLTC. The data input/output control circuit DIDO is connected to the clock control line CLKCTL(a). The two drivers DIOLTC are controlled by the output signal of the control circuit DIDO and the clocks from the left-side clock drive line LCLKDRV(a) and the right-side clock drive line RCLKDRV(a). However, the circuit 31 of FIG. 21 differs from the circuit 31 of FIG. 5 in the clock-signal supply path. For example, the treelike clock interconnection CLKCTL(a) shown in FIG. 19 is inputted to the data input/output control circuit DIDO, and the treelike clock interconnections LCLKDRV(a) and RCLKDRV(a) shown in FIG. 19 are inputted to the right and left drivers DIOLTC respectively.

Figure 22:
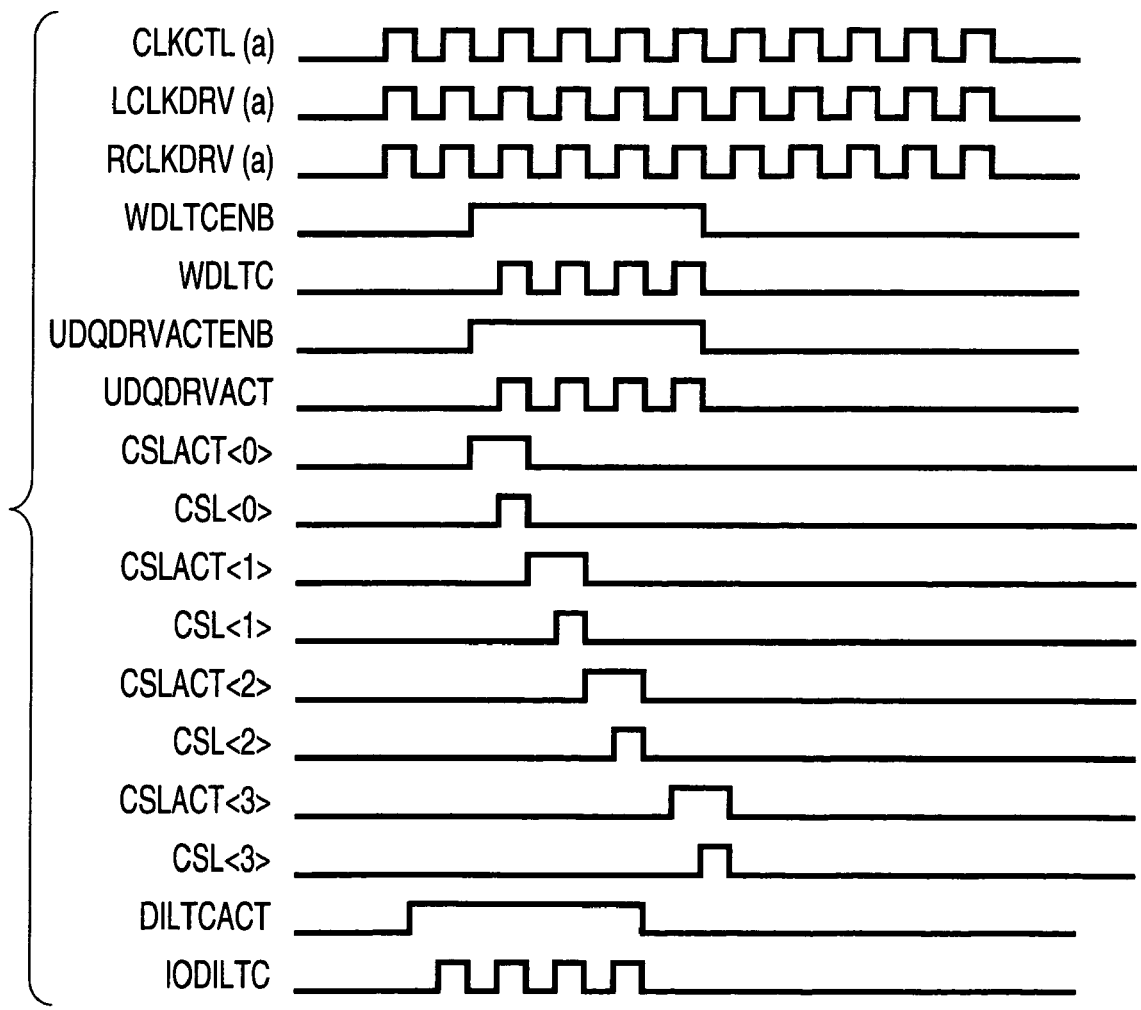
FIG. 22 is a timing chart for explaining an operation of the circuit of FIG. 20.

FIG. 22 shows the data write operation from the I/O block 21 (and 11) to the one-side memory blocks 64C and 54C of the DQB blocks 64B and 54B as an example of the circuit operation in FIG. 20 and FIG. 21.

In the fifth embodiment, when the basic clock is directly inputted to each control signal driver, the enable signal for the DQB control signal driver is not the in-phase signal of the synchronous clock in which the same number of basic synchronous clocks as the burst cycle number is generated, but the signal which is activated during the burst length. The control signal drivers generate various DQB control signals from the H-level of the basic clock during the activating interval respectively.

Further, the UCSL activating signal UCSLACT is not the in-phase signal of the synchronous clock, but the signal which is continuously activated during the cycle in which the write operation is performed to the CSL gate of the corresponding address of each signal UCSLACT. Each UCSL driver generates each CSL signal from the H-level of the clock of the activating interval.

In the I/O block control circuit, the write data latch activating signal DILTCACT and the output data latch activating signal DOLTCACT are not the in-phase signal of the basic synchronous clock, but the signal which is activated during the interval required for the burst length. The drivers DIOLTC-1 and DIOLTC-2 generate the write data latch signal IODILTC and the output data latch signal IODOLTC from the H-level of the basic clock during the activating interval.

Figure 23:
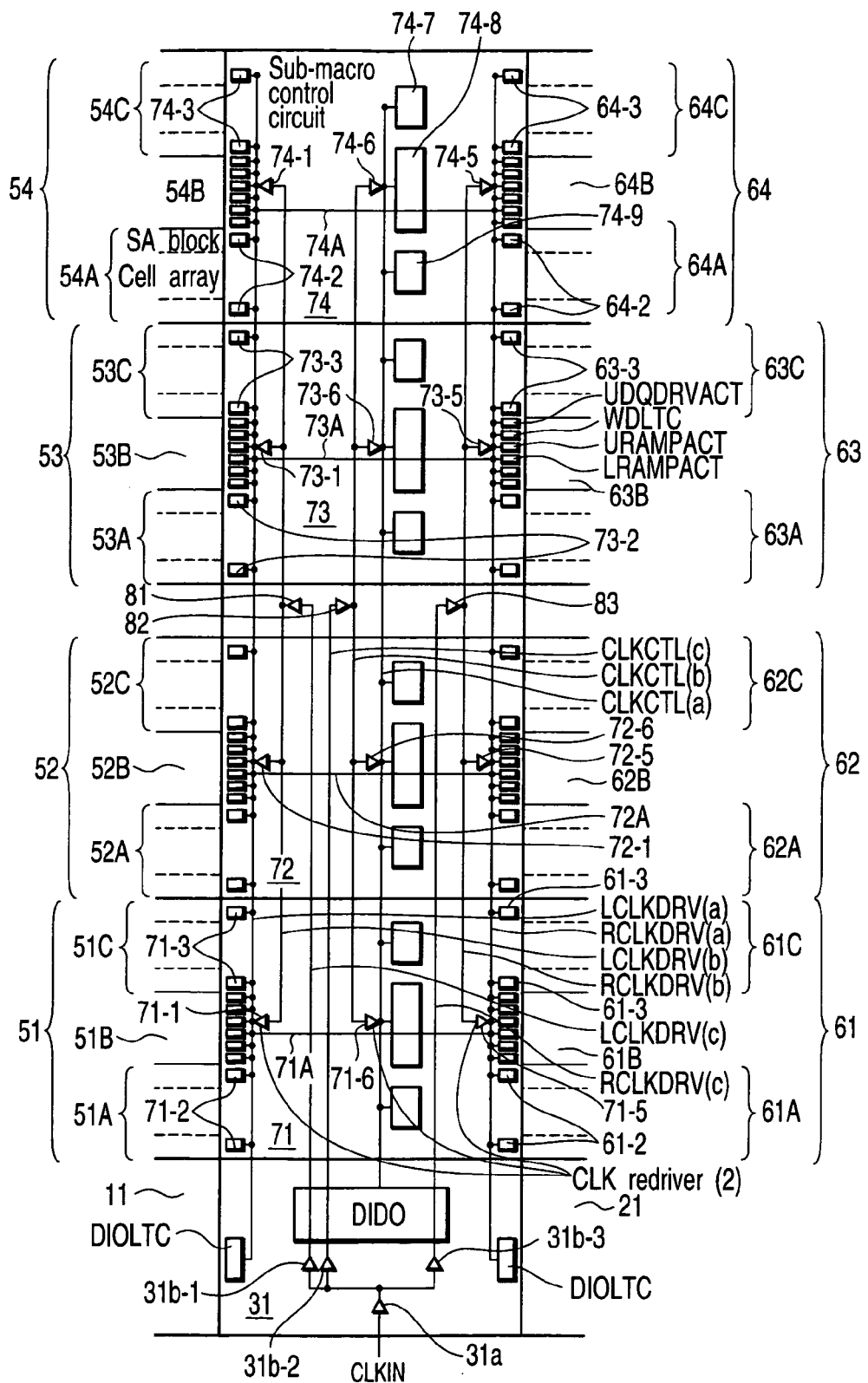
FIG. 23 is a block diagram showing a configuration of still another embodiment of the present invention.

FIG. 23 shows an example in which the outputs of the clock redrivers 31b-1 to 31b-3 in different systems of FIG. 19 are commonly connected on the input sides of the redrivers 81 to 83 by a connection line 84. Further, in the sub-macro control circuits 71 to 74, nodes on the output sides of the redrivers 71-1 to 74-1, 71-5 to 74-5, and 71-6 to 74-6 which are connected to the output sides of the clock redrivers 81 to 83 respectively are commonly connected by each of connection lines 71A to 74A.

Therefore, the skew generated between the clock supply line connected to the output sides of the redrivers 81 to 83 and the clock tree formed by the clock supply line having the three-system hierarchical structure connected to the output sides of the redrivers 71-1 to 74-1, 71-5 to 74-5, and 71-6 to 74-6 can further be reduced. Other portions in FIG. 23 are similar to the circuit of FIG. 19, so that the description will be omitted.

The fifth embodiment shown in FIG. 19 to FIG. 22 can obviously be applied to the reference example shown in FIG. 1 to FIG. 3 and the first embodiment shown in FIG. 15 in which the sub-macro is arranged only on one side of the sub-macro control circuit.

FIG. 24 is a block diagram showing a configuration of another embodiment in which the fourth embodiment is applied to the reference example shown in FIG. 1 with using the redriver shown in FIG. 18. In the fourth embodiment, the delay for the read data line RDL is reduced with the redriver. The corresponding components are designated by the reference numerals and signs equal or similar to the components shown in FIG. 1 and FIG. 18, and the detailed description will be omitted. Referring to FIG. 24, similarly to FIG. 1, plural sub-macros 2-1, 3-1, 4-1, . . . , N-1 are commonly connected to the I/O block 1-1 which is of the interface circuit through the write global data line. However, in this case, only the read data lines RDL divided by the RD driver in each DQ block are shown in the global data line. A DQB block <y+1> and a memory block 2-1C connected to the DQB block through the complementary local data lines DQt/c are connected in the sub-macro 2-1. The sub-macros 3-1, 4-1, . . . , N-1 are connected in the same way.

The DQB block <y>, . . . , <0> in each sub-macro 2-2, . . . N-1 have the internal configurations shown by arrows in FIG. 24 respectively. The DQB block <y+1> in the sub-macro 2-1 has the same configuration as the DQB blocks. For example, the DQB block <y> includes a write latch circuit 22B11, a DQ driver 22B12, the complementary local data lines DQt/c, a read amplifier circuit 22B14, and an RD driver 22B15. The write latch circuit 22B11 is connected to the write data line (not shown). The data latched by the latch circuit 22B11 is supplied to the DQ driver 22B12. The output of the DQ driver 22B12 is supplied to the complementary local data lines DQt/c. The complementary local data lines DQt/c are connected to the read amplifier circuit 22B14. The output of the read amplifier circuit 22B14 and the output from the RD driver 23B15 of the fore-step sub-macro 4-1 are supplied to the RD driver 22B15 through the read data line RDL<x>.

The RD driver 22B15 includes the NAND gates 22B15a and 22B15b and the inverter 22B15c. One of the inputs of the NAND gate 22B15a is the output of the read amplifier 22B14, and the other is the RD driver activating signal RDDRVACT<y>. Similarly to the fourth embodiment of FIG. 18, the activating signal RDDRVACT<y> is supplied from the driver 1516 of FIG. 5. The output of the NAND gate 22B15a and the output from the RD driver 23B15 of the sub-macro 4-1 are supplied to the NAND gate 22B15b, and the output of the NAND gate 22B15b is transmitted to RDL<y> after inverted by the inverter 22B15c.

When the DQB block <y> is not selected, because the RD driver activating signal RDDRVAGT<y> becomes the L-level, the output of the NAND gate 22B15a becomes the H-level irrespective of the output of the read amplifier circuit 22B14. Therefore, the NAND gate 22B15b receives the read data, transmitted on RDL<x>, from the DQB block <x> of the sub-macro 4-1, and the read data is transmitted from the inverter 22B15c to RDL<y>. On the other hand, when the DQB block <y> is selected, because the RD driver activating signal RDDRVACT<y> becomes the H-level, the NAND gate 22B15a receives the output of the read amplifier circuit 22B14, and the output of the DQB block <y> transmits from the inverter 22B15c to the RDL<y>.

The DQB block <0> to <y+1> are configure in the same way as FIG. 18, so that the detailed description will be omitted.

When the DQB block <x>23B is selected, the DQB block <0> located farthest from the I/O block 1-1 is in the non-selected state. As described above, the RD driver of the non-selected DQB block redrives the outputs the RD driver of the fore-step sub-macro. However, since the outside sub-macro does not exist in the farthest sub-macro N-1, the power supply voltage VDD is supplied to one of the inputs of the NAND gate 27B15b in the RD driver 27B15 in the power supply voltage DQB block <0>. The H-level by the power supply voltage VDD is transmitted to RDL<0> and sequentially redriven by the non-selected DQB blocks, and the H-level is transmitted to the DQB block <x>.

The H-level by the redriven power supply voltage VDD is supplied to the NAND gate 23B15b of the selected DQB block <x> through RDL<x−1>. At this point, since the RD driver activating signal RDDRVACT<x> is activated to be in the H-level, the NAND gate 23B15a is opened, and the read data outputted from the read amplifier circuit 23B14 onto the local data lines UDQt/c or LDQt/c is supplied to the NAND gate 23B15b. Since the NAND gate 23B15b is opened, the read data is transmitted from the inverter 23B15c to RDL<x>.

Because the DQB block <y> on the post-step side is not selected, the read data on RDL<x> is redriven by the RD driver of the DQB block <y> and transmitted to RDL<y>, and then the read data is transmitted to the I/O block 1-1.

Thus, the function of the RD driver in each DQB block is selected by the state of the activating signal RDDRVACT, namely, whether the RD driver is operated as the read data drive circuit of the corresponding sub-macro or the RD driver is operated as the read data redrive circuit of the fore-step DQB block is distinguished by the activating signal RDDRVACT, which allows the RD driver circuit to have the function of redriving the read data line without complicating the configuration.

In FIG. 24, the I/O block on the side opposite from the control circuit 1-3 is also provided, and the plural sub-macros 2-2, 3-2, 4-2, . . . , N-2 are connected to the I/O block 1-2 through the global data line. In reading the data from the sub-macros 2-2, 3-2, 4-2, . . . N-2 to the I/O block 1-2, similarly the RD driver can be used as the redriver.

Figure 25:
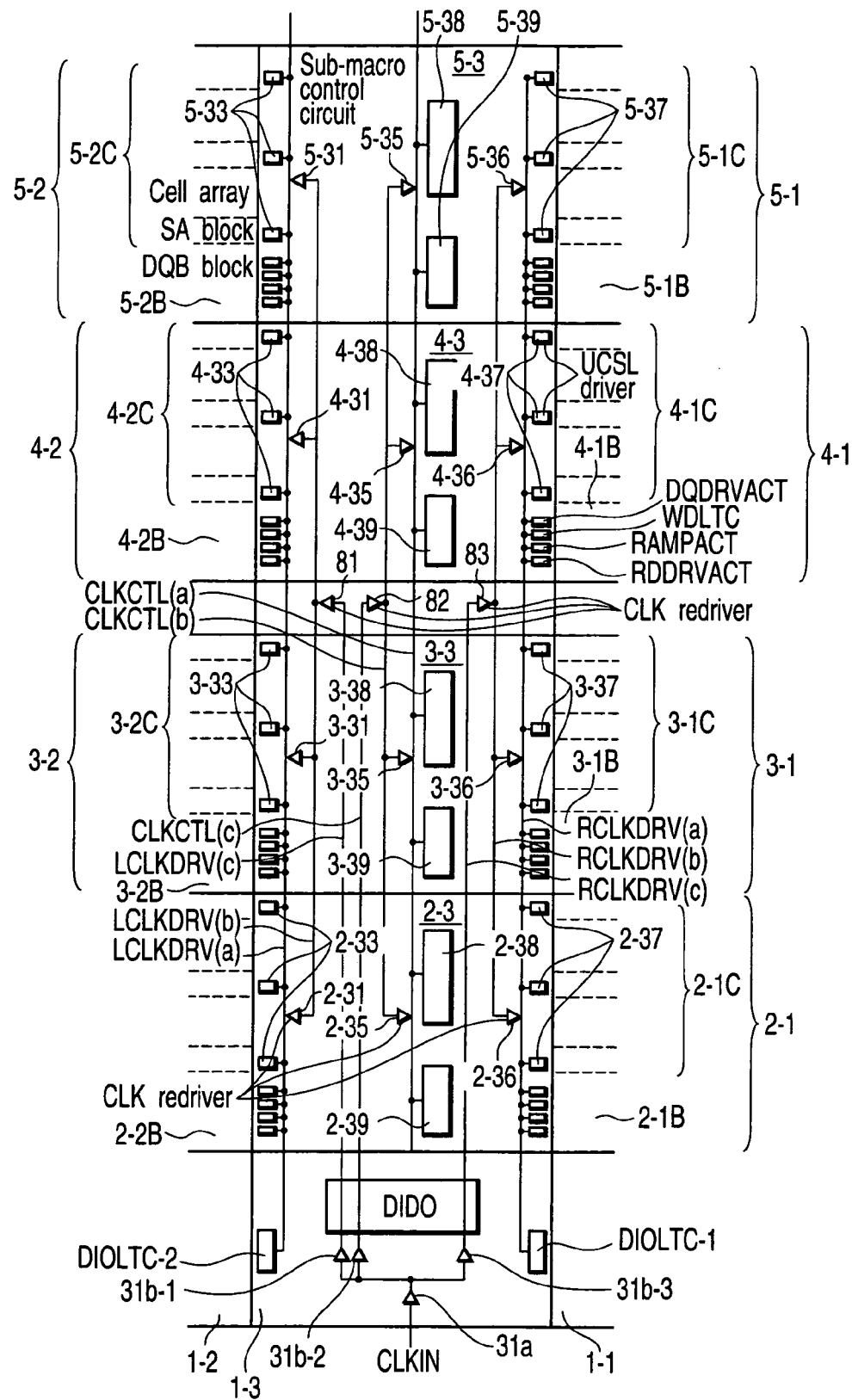
FIG. 25 is a block diagram showing a configuration of a still further embodiment in which the embodiment of FIG. 19 is applied to the reference example of FIG. 1.

FIG. 25 is a block diagram showing a configuration in which the fifth embodiment shown in FIG. 19 is applied to the reference example shown in FIG. 1. In the fifth embodiment, the clock skew is reduced by hierarchizing the supply path of the clock CLK to eDRAM.

In the embodiment shown in FIG. 25, similarly to the fifth embodiment shown in FIG. 19, the clock skew in the data line is reduced by the hierarchization (tree structure) of the supply path of the eDRAM internal basic synchronous clock CLK. Further, the three systems of the eDRAM internal synchronous clock are prepared to directly input the treelike clock to each control signal driver. Therefore, the number of logic steps from the treelike clock to each control signal is minimized, and the skew caused by the logic delay in each control circuit is also reduced. The three systems of the eDRAM internal synchronous clock include the system corresponding to the control signal driver which deals with the I/O block on the left side of each control circuit of the sub-macro, the DQB block, and the memory block, the system corresponding to the control signal driver which deals with the right-side I/O block, the DQB block, and the memory block, and the system corresponding to the memory block control circuit, the DQBCSL control circuit, and the data input/output control circuit which are of the control circuit unit in the central portion.

In FIG. 25, sub-macros 2-1, 3-1, 4-1, and 5-1 and sub-macros 2-2, 3-2, 4-2, and 5-2 are sequentially cascaded on the two I/O blocks 1-1 and 1-2 respectively. An I/O block control circuit 1-3 is formed between the I/O blocks 1-1 and 1-2, and sub-macro control circuits 2-3, 3-3, 4-3, and 5-3 are sequentially formed on one side of the I/O block control circuit 1-3.

The I/O block control circuit 1-3 includes the clock driver 31a, the three clock redrivers 31b-1, 3b-2, and 31b-3, the data input/output control circuit DIDO, and the data input/output latch driver DIOLTC. The external clock input CLKIN is supplied to the clock driver 31a. The three clock redrivers 31b-1, 3b-2, and 31b-3 divide the output of the clock driver 31a into three-system clocks.

The outputs of the clock redrivers 31b-1 to 31b-3 are connected to the clock redrivers 81, 82, and 83 which are formed in the boundary region of the sub-macro control circuits 2-3 and 5-3 at the midpoint of the sub-macro control circuits 3-3 to 4-3. The output of the clock redriver 81 is supplied to clock redrivers 2-31, 3-31, 4-31, and 5-31, which are formed for the left-side sub-macros 2-2 to 5-2 respectively. The outputs of the clock redrivers 2-31 to 5-31 are supplied to CSL drivers 2-33 to 5-33 provided corresponding to memory blocks 2-2C to 5-2C and plural drivers formed corresponding to DQB blocks 2-2B to 5-2B. The outputs of the clock redrivers 71-1 to 74-1 are also supplied to the data input/output latch driver DIOLTC-2 provided corresponding to the I/O block 1-2. These drivers are formed corresponding to the drivers shown in FIG. 5 respectively.

The output of the clock redriver 83 is supplied to clock redrivers 2-36 to 5-36 which are similarly formed for the right-side sub-macros 2-1 to 5-1. The outputs of the clock redrivers 2-36 to 5-36 are supplied to CSL drivers 2-37 to 5-37 which are provided corresponding to memory blocks 2-1C to 5-1C formed in the sub-macros 2-1 to 5-1 and the plural drivers formed in DQB blocks 2-1B to 5-1B. The outputs of the clock redrivers 2-36 to 5-36 are also supplied to a data input/output latch driver DIOLTC-1 provided corresponding to the I/O block 1-1.

The output of the clock redriver 82 is supplied to clock redrivers 2-35 to 5-35, which are formed for the sub-macro control circuits 2-3 to 5-3 respectively. The output of the clock redriver 5-35 is supplied to a memory block control circuit 5-38 and a DQBCSL control circuit 5-39 in the sub-macro control circuit 5-3. The sub-macro control circuits 4-3 to 2-3 are formed in the same way.

In FIG. 25, the external clock input CLKIN received by the clock driver 31a is transmitted to the left-side clock line LCLKDRV(c), the control circuit clock line CLKCTL(c), and the right-side clock line RCLKDRV(c) through the clock redrivers 31b-1 to 31b-3 arranged in the I/O block control circuit 1-3. Then, the external clock input CLKIN is supplied to the clock redrivers 81 to 83 arranged in the center portion in the data line direction of eDRAM. The output clocks of the clock redrivers 81 to 83 are distributed to the clock redrivers 2-31 to 5-31, 2-35 to 5-35, and 2-36 to 5-36 through the left-side clock drive line LCLKDRV(b), the control circuit clock line CLKCTL(b), and the right-side clock drive line RCLKDRV(b). The outputs of the redrivers 2-31 to 5-31, 2-35 to 5-35, and 2-36 to 5-36 are finally supplied to the left-side clock drive line LCLKDRV(a), the control circuit clock line CLKCTL(a), and the right-side clock drive line RCLKDRV(a) respectively.

The three left-side clock drive lines LCLKDRV(a), LCLKDRV(b), and LCLKDRV(c) constitute the clock tree for the control signal drivers which deal with the I/O block 1-2 on the left side of each control circuit and the sub-macros 2-2 to 5-2. The three clock drive lines RCLKDRV(a), RCLKDRV(b), and RCLKDRV(c) constitute the clock tree for the control signal drivers which deal with the I/O block 1-1 on the right side of each control circuit and the sub-macros 2-1 to 5-1. The three clock drive lines CLKCTL(a), CLKCTL(b), and CLKCTL(c) constitute the clock tree corresponding to each control circuit in the center portion. Any one of the clock trees has the circuit configuration in which the clock-signal skew reduction effect is enhanced in the sub-macro control circuits 2-3 to 5-3.

Figure 26:
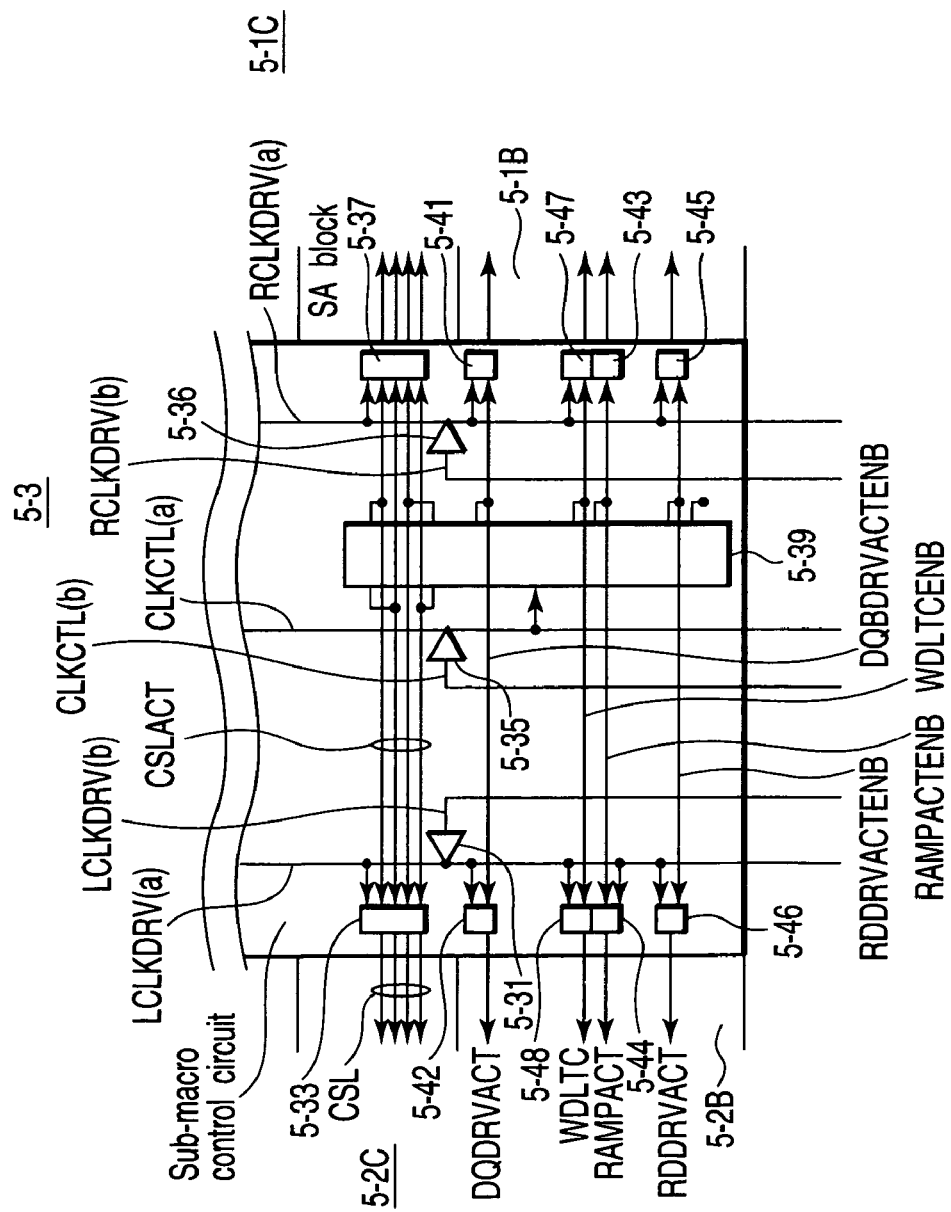
FIG. 26 is a block diagram showing a part of the circuit of FIG. 25.
Figure 27:
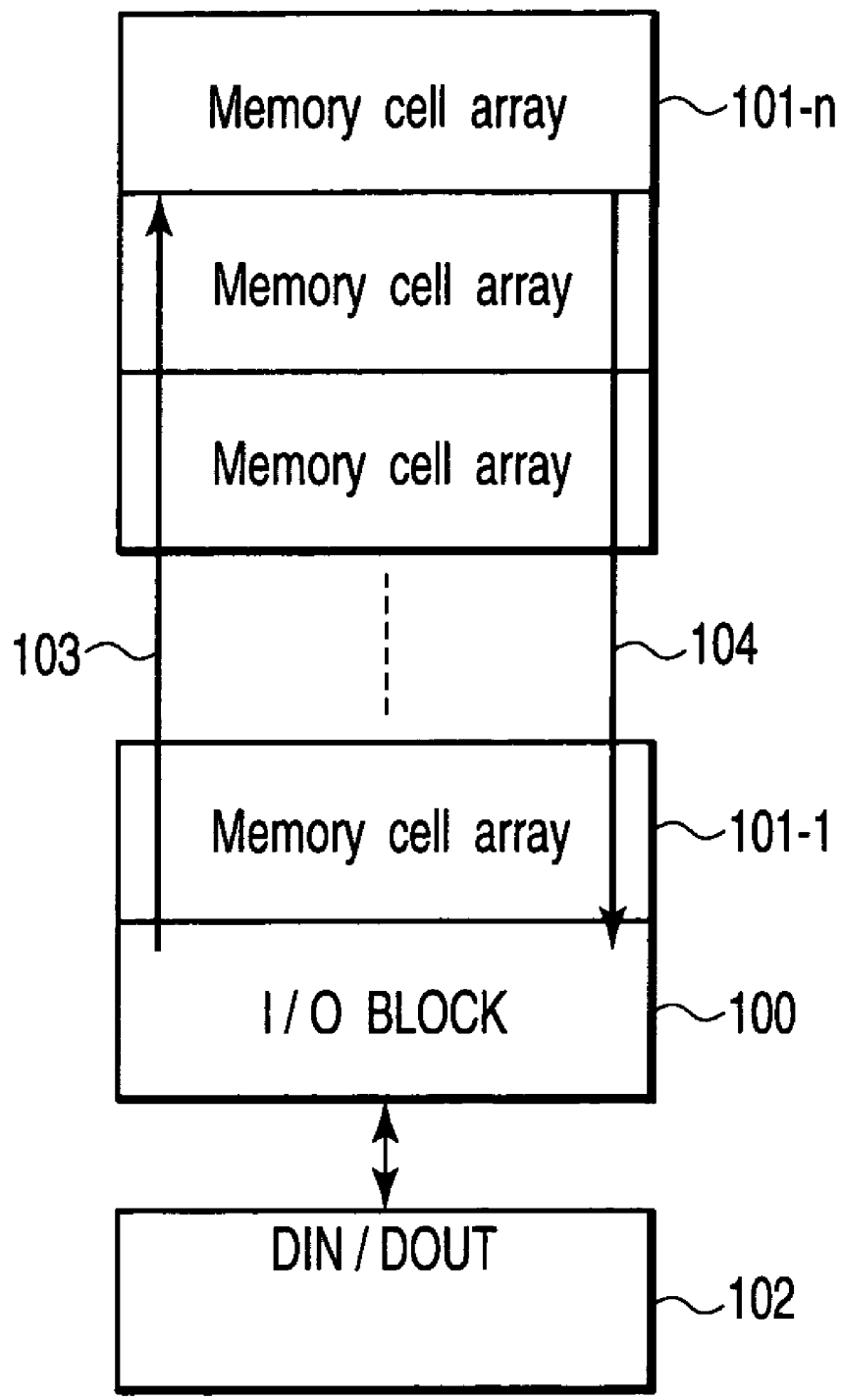
FIG. 27 is a block diagram showing an entire configuration of a conventional eDRAM.

FIG. 26 is a block diagram showing an example of the detailed configuration of the DQBCSL control circuit and the associated portions in the sub-macro control circuits 2-3 to 5-3 shown in FIG. 25. The configuration shown in FIG. 26 is similar to that shown in FIG. 20 except that the memory block is arranged only one side of the DQB block in each sub-macro. Therefore, the corresponding components are designated by the reference numerals and signs identical or similar to those shown in FIG. 20.

The sub-macro control circuit 5-3 includes a DQBCSL control circuit 5-39, CSL drivers 5-33 and 5-37, DQ driver activating signal (DQDRVACT) drivers 5-41 and 5-42, read amplifier activating signal (RAMPACT) drivers 5-43 and 5-44, read driver activating signal (RDDRVACT) drivers 5-45 and 5-46, and write latch signal (WDLTC) drivers 5-47 and 5-48. The eDRAM internal basic clock CLK is supplied to the DQBCSL control circuit 5-39 through the clock drive line CLKCTL(a) in which the tree structure of the eDRAM internal basic clock CLK is formed. The DQBCSL control circuit 5-39 is operated in synchronization with the clock from the treelike clock drive line CLKCTL(a).

The sub-macro control circuit 5-3 will be described more specifically. In reading the data, the DQBCSL control circuit 5-39 receives the read command and the memory block selection signal allocated to the sub-macro, and the DQBCSL control circuit 5-39 activates the read driver enable signal RDDRVACTENB in synchronization with the clock on the clock drive line CLKCTL(a) in which the tree structure of the treelike eDRAM internal basic clock CLK is formed. The DQBCSL control circuit 5-39 causes the drivers 5-45 and 5-46 to generate the driver activating signal RDDRVACT. At the same time, the enable signal RDDRVACTENB is activated, and the read amplifier activating signal RAMPACT is generated from the drivers 5-44 and 5-43.

In writing the data, the DQBCSL control circuit 5-39 receives the write command and the memory block selection signal allocated to the sub-macro, the DQBCSL control circuit 5-39 activates the write latch enable signal WDLTCENB in synchronization with the eDRAM internal basic clock CLK, and the write latch signal WDLTC is generated the write latch drivers 5-47 and 5-48. At the same time, the enable signal DQDRVACTENB is activated, and the activating signal DQDRVACT is generated from the drivers 5-42 and 5-41.

Further, in both reading and writing the data, the DQBCSL control circuit 5-39 receives the read command, the write command WT, or the memory block selection signal allocated to the sub-macro, and the DQBCSL control circuit 5-39 activates the driver activating signal CSLACT to selectively activate the driver 5-33 and 5-37.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   an interface unit which is connected to an external circuit;
   a plurality of sub-macros which are connected to the interface unit through a global data line; and
   a sub-macro control circuit which is connected to the sub-macros,
   wherein each of the plurality of sub-macros includes a data control unit connected to the global data line, a first memory block connected onto one side of the data control unit through a first local data line, and a second memory block connected to the other side of the data control unit through a second local data line.

2. The semiconductor memory device according to claim 1, wherein the global data line includes a read data line and a write data line,
   the data control unit includes a write data latch circuit which is shared with the first and second memory blocks, the write data latch circuit latching data of the write data line, and a read amplifier circuit which is shared with the first and second memory blocks, the read amplifier circuit selectively capturing data on the first and second local data lines, and
   the data control unit performs write to one of the first and second memory blocks, and the data control unit simultaneously performs data read from the other of the first and second memory blocks.

3. The semiconductor memory device according to claim 2, wherein the read amplifier circuit includes an amplifying circuit, a read data selection circuit which is connected between the amplifying circuit and local data read lines of the first and second memory blocks, and a read output latch circuit which latches amplified output from the amplifying circuit.

4. The semiconductor memory device according to claim 1, wherein line lengths of the first and second local data lines are substantially equal to each other.

5. The semiconductor memory device according to claim 2, wherein the interface unit includes at least first and second I/O blocks and an I/O block control circuit shared by the first and second I/O blocks,
   at least a first sub-macro of the plurality of sub-macros is connected to the first I/O block,
   at least a second sub-macro of the plurality of sub-macros is connected to the second I/O block, and
   the sub-macro control circuit is shared by the first and second I/O blocks.

6. The semiconductor memory device according to claim 5, wherein the sub-macro control circuit includes a sub-macro selecting circuit for selecting one of the first and second sub-macros based on a read/write command and a memory block selection signal.

7. The semiconductor memory device according to claim 5, wherein memory blocks provided in the first and second sub-macros having the same memory scale are allocated with the same bank address.

8. A semiconductor memory device comprising:
an interface unit which is connected to an external circuit;
a plurality of sub-macros which are connected to the interface unit through a global data line; and
a sub-macro control circuit which is connected to the sub-macros,
wherein each of the plurality of sub-macros includes a first data control unit connected to the global data line and a first memory block connected to one side of the first data control unit through a local data line, and
the global data line includes at least one redriver which is connected to a predetermined position of the global data line with respect to the plurality of sub-macros.

9. The semiconductor memory device according to claim 8, wherein each of the sub-macros further comprising a second memory block connected to the other side of the first data control unit via a second local data line, and the first data control unit has a read amplifier circuit which is shared with the first and second memory blocks connected to the first data control unit.

10. The semiconductor memory device according to claim 9, wherein the redriver includes a logic circuit which generates a logical operation output between an output of the read amplifier circuit and read data obtained from another data control unit provided in an adjacent sub-macro for transmitting the logical operation output.

11. The semiconductor memory device according to claim 9, wherein the redriver is provided in each of the sub-macros.

12. The semiconductor memory device according to claim 11, wherein the redriver is provided at a position in the global data line corresponding to a boundary portion of two adjacent memory blocks.

13. The semiconductor memory device according to claim 9, wherein line lengths of the first and second local data lines are substantially equal to each other.

14. The semiconductor memory device according to claim 9, wherein the read amplifier circuit includes an amplifying circuit, a read data selection circuit which is connected between the amplifying circuit and local data read lines of the first and second memory blocks, and a read output latch circuit which latches amplified output from the amplifying circuit.

15. The semiconductor memory device according to claim 10, wherein the logic circuit includes a read data driver acting as the redriver for transmitting the read data to a next sub-macro.

16. The semiconductor memory device according to claim 10, wherein the logic circuit includes a first NAND gate supplied with an output of the read amplifier circuit and a read driver activating signal, a second NAND circuit supplied with an output of the first NAND gate, and an inverter supplied with an output of the second NAND gate, the second NAND gate further receiving a read data output from the adjacent sub-macro.

17. A semiconductor memory device comprising:
an I/O block which is connected to an external circuit;
a plurality of sub-macros which are connected to the I/O block through a global data line;
a sub-macro control circuit which is arranged adjacent to each of the plurality of sub-macros; and
an I/O block control circuit which is adjacent to the I/O block, the I/O block control circuit being arranged adjacent to the sub-macro control circuit,
wherein each of the plurality of sub-macros includes a data control unit connected to the global data line and a memory block connected to the data control unit through a local data line,
the sub-macro control circuit includes a first driver circuit group corresponding to a control signal supplied to the memory block, a second driver circuit group corresponding to a control signal supplied to the data control unit, and data/memory block control signal activating circuit which generates a plurality of activating signals supplied to the first driver circuit group and the second driver circuit group,
the I/O block control circuit includes a third driver circuit group corresponding to a control signal supplied to the I/O block and an I/O block control signal activating circuit which generates an activating signal supplied to the third driver circuit group,
the I/O block control circuit includes a first clock interconnection, through which a clock signal is supplied to the data/memory block control signal activating circuit, and the I/O block control signal activating circuit and a second clock interconnection through which the clock signal is supplied to the first, second, and third driver circuit groups,
the first and second driver circuit groups in the plurality of sub-macros and the third driver circuit group in the I/O block generate the corresponding control signals in synchronization with the clock signal during activating intervals of the corresponding activating signals respectively,
the I/O block control circuit includes first and second clock drive circuits corresponding to the first and second clock interconnections.

18. The semiconductor memory device according to claim 17, wherein the first clock interconnection has a hierarchical structure, in which output of the first clock drive circuit is set at the first position and input to the data/memory block control signal activating circuit in each sub-macro and input to the I/O block control signal activating circuit in the I/O block control circuit are set at the last position, and
the second clock interconnection has a hierarchical structure, in which output of the second clock drive circuit is set at the first position and input to the first and second driver circuit groups in each sub-macro and input to the third driver circuit group in the I/O block control circuit is set at the last position.

19. The semiconductor memory device according to claim 18, wherein the first clock interconnection has a first clock redriver circuit at a predetermined position of the clock hierarchical structure and the second clock interconnection has a second clock redriver circuit at a position of the clock hierarchical structure corresponding to that of the first clock redriver circuit.

20. The semiconductor memory device according to claim 18, wherein each of the plurality of sub-macros includes a first memory block connected onto one side of the data control unit through a first local data line, and a second memory block connected to the other side of the data control unit through a second local data line.

* * * * *